(12) United States Patent
Egawa

(10) Patent No.: US 8,941,200 B2
(45) Date of Patent: Jan. 27, 2015

(54) SOLID-STATE IMAGING DEVICE

(71) Applicant: Kabushiki Kaisha Toshiba, Minato-ku (JP)

(72) Inventor: Yoshitaka Egawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/944,327

(22) Filed: Jul. 17, 2013

(65) Prior Publication Data

US 2014/0021574 A1    Jan. 23, 2014

(30) Foreign Application Priority Data

Jul. 23, 2012    (JP) ................................ 2012-162989

(51) Int. Cl.
| | | |
|---|---|---|
| *H01L 31/0232* | (2014.01) | |
| *H01L 31/0203* | (2014.01) | |
| *H01L 27/146* | (2006.01) | |

(52) U.S. Cl.
   CPC ...... *H01L 27/14625* (2013.01); *H01L 27/1461* (2013.01); *H01L 27/14629* (2013.01); *H01L 27/14641* (2013.01)
   USPC ........ 257/432; 257/12; 257/80; 257/E13.127; 438/70

(58) Field of Classification Search
   CPC ..................... H01L 27/1461; H01L 27/14625; H01L 27/14641; H01L 27/14629; H01L 31/02
   USPC ................. 257/12, 80, 432, E31.127; 438/70
   See application file for complete search history.

(56) References Cited

U.S. PATENT DOCUMENTS

| | | | | |
|---|---|---|---|---|
| 7,110,034 | B2* | 9/2006 | Suda ............................. | 348/340 |
| 8,289,422 | B2* | 10/2012 | Hiramoto et al. ............. | 348/273 |
| 2005/0205879 | A1* | 9/2005 | Fukunaga ....................... | 257/80 |
| 2005/0213221 | A1 | 9/2005 | Hoshuyama | |
| 2007/0221829 | A1 | 9/2007 | Nakagawa et al. | |
| 2007/0272829 | A1* | 11/2007 | Nakagawa et al. ......... | 250/208.1 |
| 2008/0135828 | A1* | 6/2008 | Fukunaga ....................... | 257/12 |
| 2009/0321865 | A1* | 12/2009 | Kasano et al. ................ | 257/432 |
| 2010/0019129 | A1* | 1/2010 | Ishigaki et al. ............. | 250/208.1 |
| 2011/0272772 | A1* | 11/2011 | Kokubun ....................... | 257/432 |
| 2012/0001285 | A1* | 1/2012 | Kokubun et al. .............. | 257/432 |

FOREIGN PATENT DOCUMENTS

| | | |
|---|---|---|
| JP | 4-328866 | 11/1992 |
| JP | 8-54623 | 2/1996 |
| JP | 10-22485 | 1/1998 |
| JP | 10-84455 | 3/1998 |
| JP | 2004-144841 | 5/2004 |
| JP | 2004-200358 | 7/2004 |
| JP | 2005-259750 | 9/2005 |
| JP | 2007-259232 | 10/2007 |
| JP | 2007-318002 | 12/2007 |

* cited by examiner

*Primary Examiner* — Fernando L Toledo
*Assistant Examiner* — Adam S Bowen
(74) *Attorney, Agent, or Firm* — Oblon, Spivak, McClelland, Maier & Neustadt, L.L.P.

(57) ABSTRACT

According to one embodiment, provided are a first photoelectric conversion layer provided for a first wavelength band, a second photoelectric conversion layer provided for a second wavelength band, and a color separation element adapted to separate an incident light into a transmission light including the first wavelength band and a reflection light including the second wavelength band, wherein an angle of incidence of the incident light with respect to a reflection surface of the color separation element is set so that a vertically polarized light and a horizontally polarized light are included in the reflection light.

19 Claims, 25 Drawing Sheets

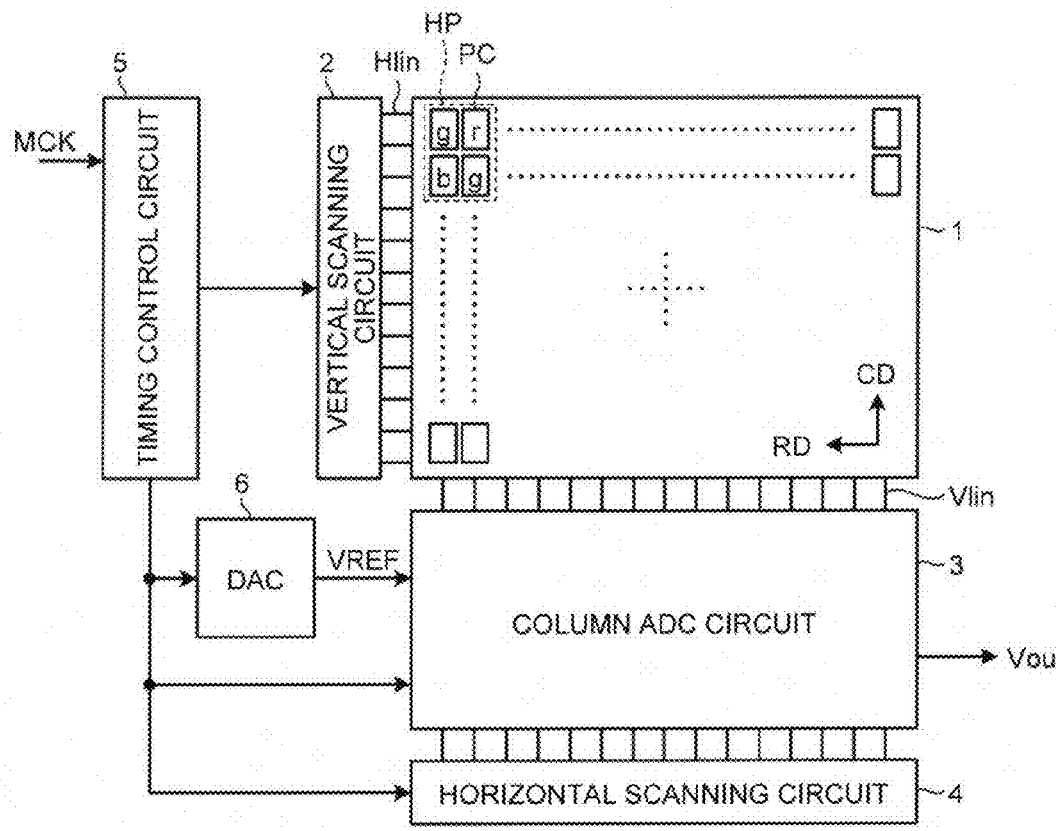
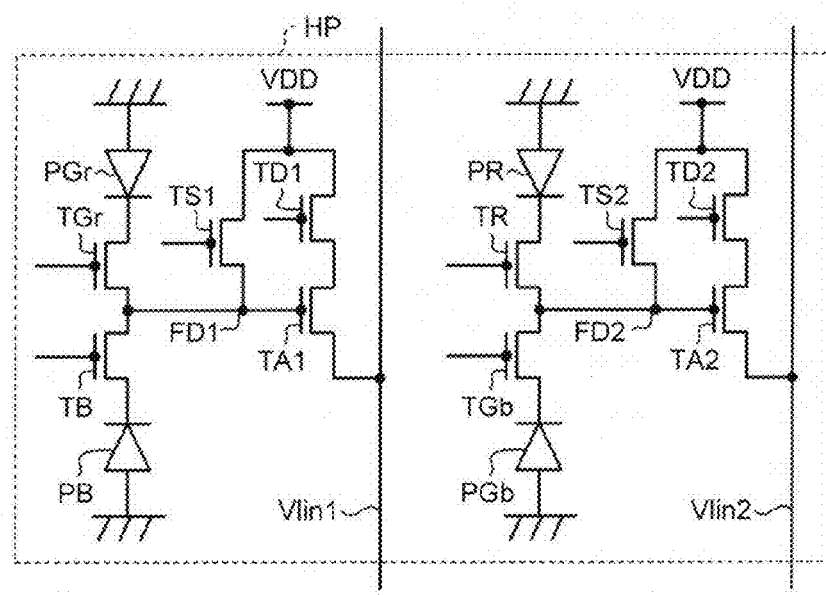

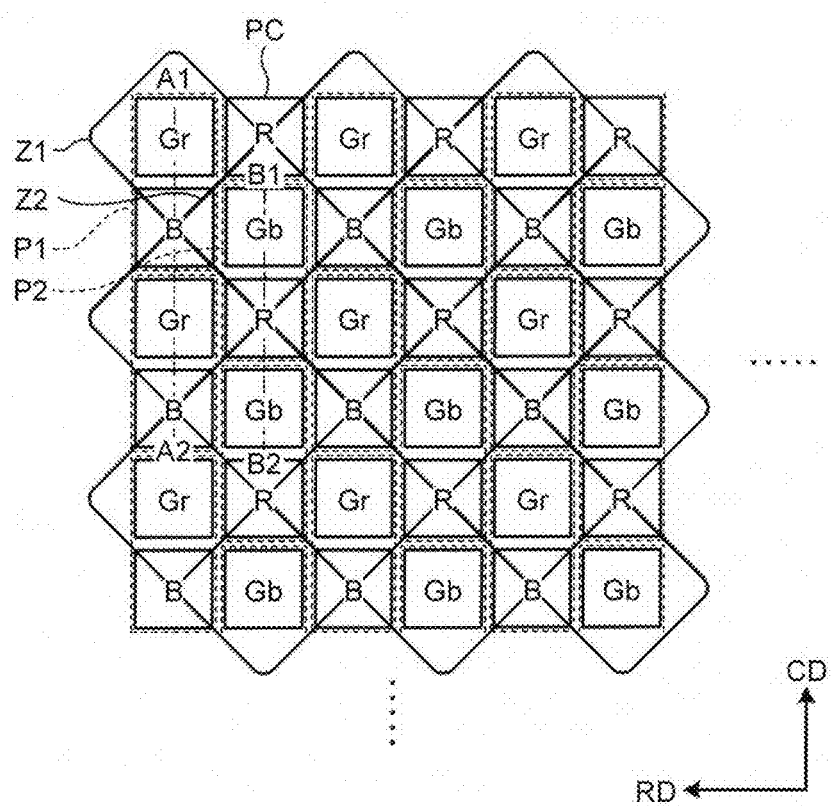

SOLID-STATE IMAGING DEVICE

CROSS-REFERENCE TO RELATED APPLICATIONS

This application is based upon and claims the benefit of priority from Japanese Patent Application No. 2012-162989, filed on Jul. 23, 2012; the entire contents of which are incorporated herein by reference.

FIELD

Embodiments described herein relate generally to a solid-state imaging device.

BACKGROUND

In recent years, there has been a demand for a thinner and higher-resolution camera module mounted on cellular phones and the like. In order to meet the thinner and higher-resolution camera modules, refinement of the pixels in an image sensor has progressed. In the image sensor, the smaller the pixel area is, the smaller the light amount entering the pixel is, so that the signal amount is reduced and the signal to noise ratio (SNR) is thus degenerated. Therefore, for the image sensor, it has been desired to achieve the higher sensitivity by the improved efficiency in optical utilization.

BRIEF DESCRIPTION OF THE DRAWINGS

FIG. 1 is a block diagram illustrating schematic configuration of a solid-state imaging device according to a first embodiment;

FIG. 2 is a circuit diagram illustrating an example of the configuration for four pixels in a Bayer arrangement of the solid-state imaging device of FIG. 1;

FIG. 3 is a plane view illustrating an example of the arrangement of pixel cells of the solid-state imaging device according to the first embodiment;

DETAILED DESCRIPTION

Figure 4:
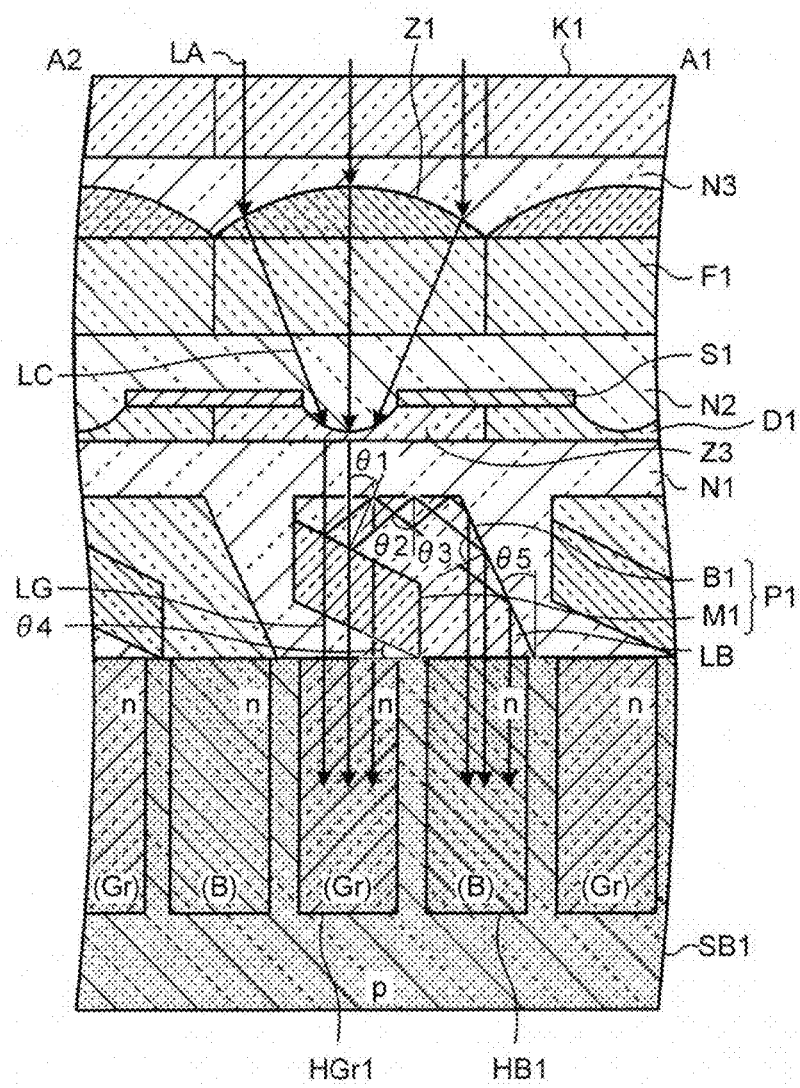
FIG. 4 is a cross-sectional view illustrating an example of the configuration taken along a line A1-A2 of FIG. 3.

In general, according to one embodiment, a first photoelectric conversion layer, a second photoelectric conversion layer, and a color separation element are provided. The first photoelectric conversion layer is provided for a first wavelength band. The second photoelectric conversion layer is provided for a second wavelength band. The color separation element separates an incident light into a transmission light including the first wavelength band and a reflection light including the second wavelength band. An angle of incidence of the incident light onto an incidence plane in the color separation element is set so that a vertically polarized light and a horizontally polarized light are included in the reflection light.

The solid-state imaging device according to the embodiments will be described in detail below by referring to the attached drawings. It is noted that the present invention is not limited by these embodiments.

First Embodiment

FIG. 1 is a block diagram illustrating schematic configuration of a solid-state imaging device according to a first embodiment.

In FIG. 1, provided are a pixel array unit 1 in which pixels PC adapted to accumulate the photoelectric-converted charges are arranged in a matrix in the row direction RD and the column direction CD, a vertical scanning circuit 2 for scanning the pixels PC to be read out in the vertical direction, a column ADC circuit 3 for detecting a signal component of each pixel PC at the CDS, a horizontal scanning circuit 4 for scanning the pixels PC to be read out in the vertical direction, a timing control circuit 5 for controlling the timing of reading out and/or accumulating each pixel PC, and a reference voltage generating circuit 6 for outputting a reference voltage VREF to the column ADC circuit 3. It is noted that a master clock MCK is inputted to the timing control circuit 5.

In the pixel array unit 1, the row direction RD is provided with horizontal control lines Hlin for controlling the readout of the pixels PC, while the column direction CD is provided with vertical control lines Vlin for transmitting the signal read out from the pixels PC.

Further, in the pixel array unit 1, a Bayer arrangement HP is formed in which four pixels PC make up of one set. In this Bayer arrangement HP, two pixels g for green are arranged in one orthogonal direction, while one pixel r for red and one pixel b for blue are arranged in the other orthogonal direction.

Then, in response that the pixels PC are scanned in the vertical direction at the vertical scanning circuit 2, the pixels PC are selected in the row direction RD and the signals read out from those pixels PC are sent to the column ADC circuit 3 via the vertical signal lines Vlin. Further, the difference between the signal level of the signal read out from the pixel PC and the reference level is obtained and, therefore, the signal component of each pixel PC is detected at the CDS and outputted as the output signal Vout.

FIG. 2 is a circuit diagram illustrating an example of the configuration for four pixels in a Bayer arrangement of the solid-state imaging device of FIG. 1.

In FIG. 2, the Bayer arrangement HP is provided with photodiodes PB, PR, PGr, and PGb, column selection transistors TD1 and TD2, amplification transistors TA1 and TA2, reset transistors TS1 and TS2, and readout transistors TB, TR, TGr, and TGb. The row selection transistor TD1, the amplification transistor TA1, and the reset transistor TS1 are shared by the photodiodes PB and PGr, while the row selection transistor TD2, the amplification transistor TA2, and the reset transistor TS2 are shared by the photodiodes PR and PGb. The readout transistor TB, TR, TGr, and TGb are provided for the photodiodes PB, PR, PGr, and PGb, respectively. Further, a floating diffusion FD1 is formed as a detection node at the connection of the amplification transistor TA1, the reset transistor TS1, and the readout transistors TB and TGr. A floating diffusion FD2 is formed as a detection node at the connection of the amplification transistor TA2, the reset transistor TS2, and the readout transistors TR and TGb.

The source of the readout transistor TGr is connected to the photodiode PGr, the source of the readout transistor TB is connected to the photodiode PB, the source of the readout transistor TR is connected to the photodiode PR, and the source of the readout transistor TGb is connected to the photodiode PGb. The source of the reset transistor TS1 is connected to the drains of the readout transistors TGr and TB, the source of the reset transistor TS2 is connected to the drains of the readout transistors TGb and TR, the drains of the reset transistors TS1 and TS2 and the row selection transistors TD1 and TD2 are connected to a power supply potential VDD. The source of the amplification transistor TA1 is connected to the vertical signal line Vlin1, the gate of the amplification transistor TA1 is connected to the drains of the readout transistors TGr and TB, and the drain of the amplification transistor TA1 is connected to the source of the row selection transistor TD1. The source of the amplification transistor TA2 is connected to the vertical signal line Vlin2, the gate of the amplification transistor TA2 is connected to the drains of the readout transistors TGb and TR, and the drain of the amplification transistor TA2 is connected to the source of the row selection transistor TD2.

It is noted that, although the case where the row selection transistors TD1 and TD2 are provided to the pixel has been described in the example of FIG. 2, the pixel may not be provided with the row selection transistors TD1 and TD2. Further, although the configuration of two pixels in one cell has been described in the example of FIG. 2, it may be configured as four pixels in one cell or eight pixels in one cell, and thus there is no limitation.

Figure 5:
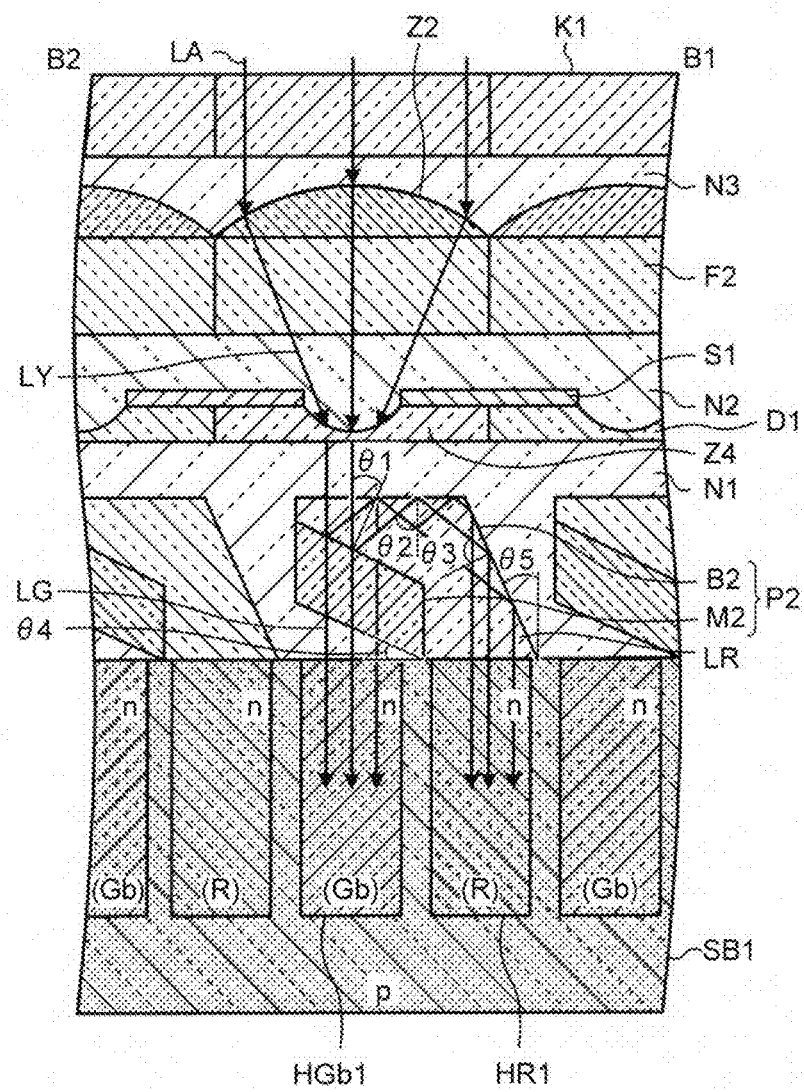
FIG. 5 is a cross-sectional view illustrating an example of the configuration taken along a line B1-B2 of FIG. 3.

FIG. 3 is a plane view illustrating an example of the arrangement of pixel cells of the solid-state imaging device according to the first embodiment, FIG. 4 is a cross-sectional view illustrating an example of the configuration taken along a line A1-A2 of FIG. 3, and FIG. 5 is a cross-sectional view illustrating an example of the configuration taken along a line B1-B2 of FIG. 3. It is noted that a back surface irradiating type CMOS sensor is exemplified in this first embodiment.

In FIG. 3 to FIG. 5, a semiconductor layer SB1 is formed with a photoelectric conversion layer R for red, photoelectric conversion layers Gr and Gb for green, and a photoelectric conversion layer B for blue. It is noted that the material of the semiconductor layer SB1 can be selected from, for example, Si, Ge, SiGe, SiC, SiSn, PbS, GaAs, InP, InGaAsP, GaP, GaN, ZnSe, and so on. Further, the semiconductor layer SB1 may be set as the p-type. The photoelectric conversion layer R for red, the photoelectric conversion layers Gr and Gb for green, and the photoelectric conversion layer B for blue may be set as the n-type.

The photoelectric conversion layer R for red, the photoelectric conversion layers Gr and Gb for green, and the photoelectric conversion layer B for blue are arranged in the Bayer arrangement. Further, an impurity diffusion layer HR1 is formed in the photoelectric conversion layer R for red, and an impurity diffusion layer HB1 is formed in the photoelectric conversion layer B for blue. An impurity diffusion layer HGr1 is formed in the photoelectric conversion layer Gr for green and an impurity diffusion layer HGb1 is formed in the photoelectric conversion layer Gb for green. It is noted that the photoelectric conversion layer R for red may make up of the photodiode PR of FIG. 2. The photoelectric conversion layer Gr for green may make up of the photodiode PGr of FIG. 2. The photoelectric conversion layer Gb for green may make up of the photodiode PGb of FIG. 2. The photoelectric conversion layer B for blue may make up of the photodiode PB of FIG. 2.

On the photoelectric conversion layer B for blue and over the photoelectric conversion layer Gr for green, a color separation element P1 is disposed for a pair of the photoelectric conversion layer B for blue and the photoelectric conversion layer Gr for green in the column direction CD. On the photoelectric conversion layer R for red and over the photoelectric conversion layer Gb for green, a color separation element P2 is disposed for a pair of the photoelectric conversion layer R for red and the photoelectric conversion layer Gb for green in the column direction CD. The color separation elements P1 and P2 are able to transmit the green light LG and guide it to the photoelectric conversion layer Gr for green and the photoelectric conversion layer Gb for green, respectively, while reflect the blue light LB and the red light LR and guide them to the photoelectric conversion layer B for blue and the photoelectric conversion layer R for red, respectively.

The color separation elements P1 and P2 are provided with dichroic filters M1 and M2 and reflection blocks B1 and B2, respectively. The dichroic filters M1 and M2 are able to transmit the green light LG and reflect the blue light LB and the red light LR. The reflection blocks B1 and B2 support the dichroic filters M1 and M2 and are able to guide the reflection lights through the dichroic filters M1 and M2 to the photoelectric conversion layer B for blue and the photoelectric conversion layer R for red, respectively. The dichroic filters M1 and M2 are disposed over the photoelectric conversion layers Gr and Gb for green, respectively. The bottom surfaces of the reflection blocks B1 and B2 are disposed on the photoelectric conversion layer B for blue and the photoelectric conversion layer R for red, respectively, such that the reflection blocks B1 and B2 protrude on the dichroic filters M1 and M2. The reflection blocks B1 and B2 are provided with two reflection surfaces and adapted to guide the reflection lights reflected by the dichroic filters M1 and M2 to the photoelectric conversion layer B for blue and the photoelectric conversion layer R for red, respectively, by two-time internal reflections. An interlayer insulating film N1 is formed on the color separation elements P1 and P2 so as to surround the dichroic filters M1 and M2 and the reflection blocks B1 and B2.

It is noted that a multilayer film interference filter may be used for the dichroic filters M1 and M2. The multilayer film interference filter can be configured interposing a spacer layer at a $\lambda/4$ multilayer film and can transmit the light of a wavelength band according to the optical film thickness of the spacer layer. It is noted that $\lambda$ is called as a set wavelength and is the center wavelength of the reflection wavelength band of the $\lambda/4$ multilayer film. For example, assuming that the set wavelength $\lambda$ is 550 nm, each of the optical film thickness of the dielectric layer of the $\lambda/4$ multilayer film will be 137.5 nm. Here, the optical film thickness is an index obtained by multiplying the physical film thickness of the dielectric film by its refractive index. For example, for the dichroic filters M1 and M2, the layered film may be used in which two types of dielectric layers such as high refraction layers of titanium oxide ($TiO_2$) and low refraction layers of silicon oxide ($SiO_2$) are laminated in an alternative manner. Since the refractive indices of titanium oxide and silicon oxide are 2.51 and 1.45, respectively, the physical film thicknesses of titanium oxide and silicon oxide may be 54.7 nm and 94.8 nm, respectively, in order to have the optical film thickness of 137.5 nm.

Silicon oxide can be used for the spacer layer. The physical film thickness of the spacer layer is 0 nm at the dichroic filters M1 and M2 adapted to transmit the green light LG. It is noted that two titanium layers interposing the spacer layer whose physical film thickness is 0 nm at the dichroic filters M1 and M2 adapted to transmit the green light LG have the physical film thickness of 109.4 nm as a whole.

With respect to the total number of the layers of the dichroic filters M1 and M2, that is, the total number of the layers of the $\lambda/4$ multilayer film and the spacer layer, the dichroic filters M1 and M2 adapted to transmit the green light LG may be implemented with six to twenty layers.

For the material of the reflection blocks B1 and B2, a transparent material having a higher refractive index than the interlayer insulating film N1 can be used so that the light is totally reflected inside the reflection blocks B1 and B2. For example, titanium oxide ($TiO_2$) can be used for the reflection blocks B1 and B2 and silicon oxide ($SiO_2$) can be used for the interlayer insulating film N1. In this case, assuming that the refractive index of titanium oxide is 2.5 and the refractive index of silicon oxide is 1.45, degrees or more of the angle of vertical incidence allows for the total reflection of the light inside the reflection blocks B1 and B2.

It is preferable that the angle of incidence $\theta 1$ of the incident light with respect to the reflection surface of the color separation elements P1 and P2 is set so that both vertically polarized light and horizontally polarized light are included in the reflection light reflected by the dichroic filters M1 and M2. Specifically, it is preferable that the angle of incidence $\theta 1$ is set to be within the range of 20 to 30 degrees. It is noted that the reflection surfaces of the color separation elements P1 and P2 can be configured at the incident surfaces of the dichroic filters M1 and M2.

For example, 25 degrees of the angle of inclination $\theta 4$ of the dichroic filters M1 and M2 with respect to the semiconductor layer SB1 allows the angle of incidence $\theta 1$ of the incident light to the reflection surface of the color separation elements P1 and P2 to be set to 25 degrees. A large angle of incidence $\theta 1$ causes polarization, which degenerates the color separation characteristics, because the transmission characteristics and the reflection characteristics are greatly different between the P wave (horizontally polarized light) that is parallel to the incidence surfaces of the dichroic filters M1 and M2 and the S wave (vertically polarized light) that is orthogonal to the incidence surfaces of the dichroic filters M1 and M2. In order to reduce the polarization, the angle of incidence $\theta 1$ is preferably set to be smaller than or equal to 30 degrees. However, when the angle of incidence $\theta 1$ is set to be smaller than or equal to 15 degrees, the angle of reflection $\theta 2$ will be 30 degrees resulting in no total reflection. Therefore, the angle of inclination $\theta 4$ is preferably set to be within the range of 20 degrees to 30 degrees.

Further, when the angle of incidence $\theta 1$ is 25 degrees, the angle of inclination $\theta 5$ of the reflection surfaces of the reflection blocks B1 and B2 can be set to 25 degrees so that the angle of reflection $\theta 2$ at the first reflection is 50 degrees and the angle of reflection $\theta 3$ at the second reflection is 65 degrees. As a result, this allows the transmission light transmitted through the dichroic filters M1 and M2 to vertically enter the photoelectric conversion layers Gr and Gb for green, respectively, and allows the reflection light reflected by the dichroic filters M1 and M2 to vertically enter the photoelectric conversion layer B for blue and the photoelectric conversion layer R for red, respectively.

It is noted that, when the upper surfaces of the reflection blocks B1 and B2 are set parallel to the surface of the semiconductor layer SB1, the angles of reflection θ2 and θ3 can be simply calculated from the angle of inclination θ4 of the dichroic filters M1 and M2. For example, when θ1=20 degrees, then θ2=40 degrees, θ3=70 degrees, and θ5=20 degrees. When θ1=30 degrees, then θ2=60 degrees, θ3=60 degrees, and θ5=30 degrees.

A dielectric layer D1 is laminated on the interlayer insulating film N1, and the dielectric layer D1 is provided with in-layer lenses Z3 and Z4 for the color separation elements P1 and P2, respectively. It is noted that the in-layer lenses Z3 and Z4 may be disposed over the dichroic filters M1 and M2, respectively. The in-layer lenses Z3 and Z4 are able to convert the incident light into a parallel light. A light shielding layer S1 is formed on the dielectric layer D1 so as to avoid the in-layer lenses Z3 and Z4. An interlayer insulating film N2 is formed on the in-layer lenses Z3 and Z4 and the light shielding layer S1. It is noted that, for the material of the dielectric layer D1, a transparent material having higher refractive index than the interlayer insulating film N2 can be used. For example, titanium oxide ($TiO_2$) can be used for the dielectric layer D1 and silicon oxide ($SiO_2$) can be used for the interlayer insulating film N2.

A cyan filter F1 and a yellow filter F2 are provided on the interlayer insulating film N2 for each column in an alternative manner. The cyan filter F1 is disposed on the color separation element P1, and the yellow filter F2 is disposed on the color separation element P2. The color filters such as the cyan filter F1 and the yellow filter F2 can be formed by containing a pigment or a dyestuff in the transparent film.

Micro-lenses Z1 and Z2 are disposed on the cyan filter F1 and the yellow filter F2. It is noted that the condensation area of each of the micro-lenses Z1 and Z2 may be set as large as two pixels. The center of each of the micro-lenses Z1 and Z2 may be disposed above each of the photoelectric conversion layers Gr and Gb for green. When the planer shape of each of the micro-lenses Z1 and Z2 is a square, four corners of each of the micro-lenses Z1 and Z2 may protrude over four pixels neighboring the pixel that lies under the center of each of the micro-lenses Z1 and Z2. It is noted that the planer shape of each of the micro-lenses Z1 and Z2 may be a circle or a polygon.

An interlayer insulating film N3 is formed on the micro-lenses Z1 and Z2. A refraction plate K1 is formed on the interlayer insulating film N3. It is noted that the refraction plate K1 is able to convert the incident light into a vertical light. It is noted that, for the material of the micro-lenses Z1 and Z2, a transparent material having higher refractive index than the interlayer insulating film N3 can be used. For example, titanium oxide ($TiO_2$) can be used for the micro-lenses Z1 and Z2 and silicon oxide ($SiO_2$) can be used for the interlayer insulating film N3. For the refraction plate K1, titanium oxide ($TiO_2$) can be used.

After converted into the vertical lights at the refraction plate K1, the incident lights LA are condensed by the micro-lenses Z1 and Z2, and enter the cyan filter F1 and the yellow filter F2, respectively. Then, a cyan light LC is transmitted through the cyan filter F1 and enters the in-layer lens Z3, and also a yellow light LY is transmitted through the yellow filter F2 and enters the in-layer lens Z4.

Then, after converted into the parallel light at the in-layer lens Z3, the cyan light LC enters the dichroic filter M1, so that the green light LG is transmitted and the blue light LB is reflected. Then, the green light LG enters the photoelectric conversion layer Gr for green and the green light is therefore photoelectric-converted, and the charges generated at this time are accumulated in the photoelectric conversion layer Gr for green. Further, the blue light LB reflected by the dichroic filter M1 is total-reflected twice inside the reflection block B1 and thus converted into the vertical light on the photoelectric conversion layer B for blue. Then, the blue light LB enters the photoelectric conversion layer B for blue and the blue light is therefore photoelectric-converted, and the charges generated at this time are accumulated in the photoelectric conversion layer B for blue.

On the other hand, after converted into the parallel light at the in-layer lens Z4, the yellow light LY enters the dichroic filter M2, so that the green light LG is transmitted and the red light LR is reflected. Then, the green light LG enters the photoelectric conversion layer Gb for green and the green light LG is therefore photoelectric-converted, and the charges generated at this time are accumulated in the photoelectric conversion layer Gb for green. Further, the red light LR reflected by the dichroic filter M2 is total-reflected twice inside the reflection block B2 and thus converted into the vertical light on the photoelectric conversion layer R for red. Then, the red light LR enters the photoelectric conversion layer R for red and the red light is therefore photoelectric-converted, and the charges generated at this time are accumulated in the photoelectric conversion layer R for red.

The lights that have been color-separated by respective color filters are further color-separated by the color separation elements P1 and P2, so that the incident light can be separated into three primary colors by one-time color separation at the color separation elements P1 and P2. This allows for the improved sensitivity that is twofold compared to the manner in which the incident light LA is separated into three primary colors by using the color filter only, and also allows for the improved color reproducibility compared to the manner in which two-time color separations are made at the color separation elements P1 and P2. Further, according to the manner in which the lights that have been color-separated by respective color filters are further color-separated by the color separation elements P1 and P2, the complicated manufacturing process of the color separation elements P1 and P2 can be done in one process, so that the manufacturing cost can be reduced compared to the manner in which two-time color separations are made by the color separation elements P1 and P2.

Furthermore, the angle of incidence θ1 set to be within the range of 20 to 30 degrees allows for the reduced polarization at the dichroic filters M1 and M2. This prevents the situation that the transmission characteristics and the reflection characteristics are greatly different between the P wave that is parallel to the incidence surfaces of the dichroic filters M1 and M2 and the S wave that is orthogonal to the incidence surfaces of the dichroic filters M1 and M2, so that the color separation characteristics can be improved.

Figure 6:
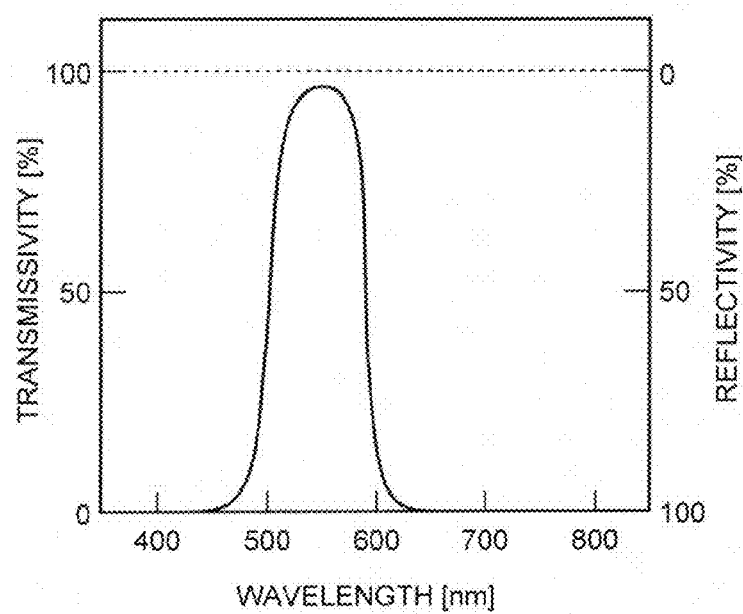
FIG. 6 is a view illustrating spectral characteristics of transmission and reflection of dichroic filters M1 and M2 of FIG. 4 and FIG. 5.

FIG. 6 is a view illustrating spectral characteristics of transmission and reflection of dichroic filters M1 and M2 of FIG. 4 and FIG. 5.

In FIG. 6, the dichroic filters M1 and M2 have a transmissivity close to 100% at the range of 490 nm to 590 nm that is the wavelength range of the green light LG, while substantially zero at other wavelength ranges. Also, the reflectivity is substantially zero at the wavelength range of the green light LG, while close to 100% at the wavelength range of the blue light LB that is below 490 nm and at the wavelength range of the red light LR that is above 590 nm.

Figure 7:
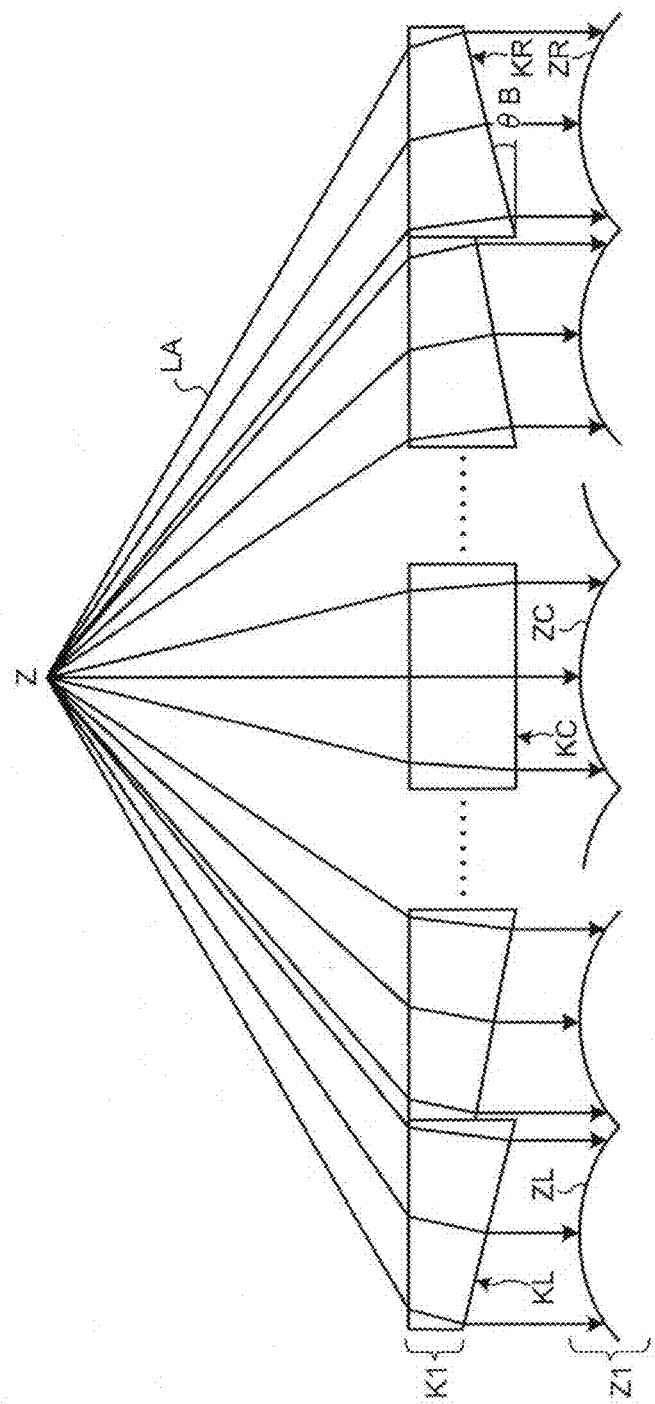
FIG. 7 is a cross-sectional view illustrating an example of the configuration from the right end to the left end of a screen in a refraction plate K1 and a micro-lens Z1 of FIG. 4.

FIG. 7 is a cross-sectional view illustrating an example of the configuration from the right end to the left end of a screen in the refraction plate K1 and the micro-lens Z1 of FIG. 4.

In FIG. 7, the refraction plate K1 is provided with inclined surfaces having different angles of inclination θB from the center toward the ends. A center inclined surface KC has the angle of inclination θB set to 0 degree, the angle of inclination θB increases from the center toward the ends, and the left end inclined surface KL and the right end inclined surface KR have the largest angle of inclination θB.

The incident light LA condensed by a condensing lens Z is converted into the vertical light by the refraction plate K1. In this case, an angle of incidence θA of the incident light LA decreases from the center toward the ends of the refraction plate K1. Therefore, since the angle of refraction is required to increase from the center toward the ends of the refraction plate K1 in order to convert the incident light LA into the vertical light, the angle of inclination θB increases from the center toward the ends of the refraction plate K1. That is, the refraction plate K1 may be formed such that the angle of inclination θB gradually increases concentrically with respect to the center of the pixel area of the sensor. Further, the incident light LA radiated via the inclined surface KR is condensed by a left end micro-lens ZL, the incident light LA radiated via the inclined surface KC is condensed by a center micro-lens ZC, and the incident light LA radiated via the inclined surface KR is condensed by a right end micro-lens ZR.

For example, when the upper part of the refraction plate K1 is air, the refraction plate K1 is formed with titanium oxide ($TiO_2$), and the interlayer insulating film N3 is formed with silicon oxide ($SiO_2$), the angle of incidence θA of the light that has entered from the condensing lens Z is substantially 0 degree at the center and 30 degrees at the left and right ends. Therefore, when the angle of inclination θB of the refraction plate K1 is substantially 0 degree at the center and 26 degrees at the left and right ends, this allows the light with 30 degrees of the angle of incidence θA to enter the micro-lens Z1 substantially vertically.

The use of such refraction plate K1 allows for the substantially vertical incidence to the micro-lens Z1 even if the angle of incidence θA of the incident light LA decreases from the center toward the ends of the refraction plate K1, so that the stable color reproducibility can be achieved over the entire area of the screen.

Second Embodiment

Figure 8:
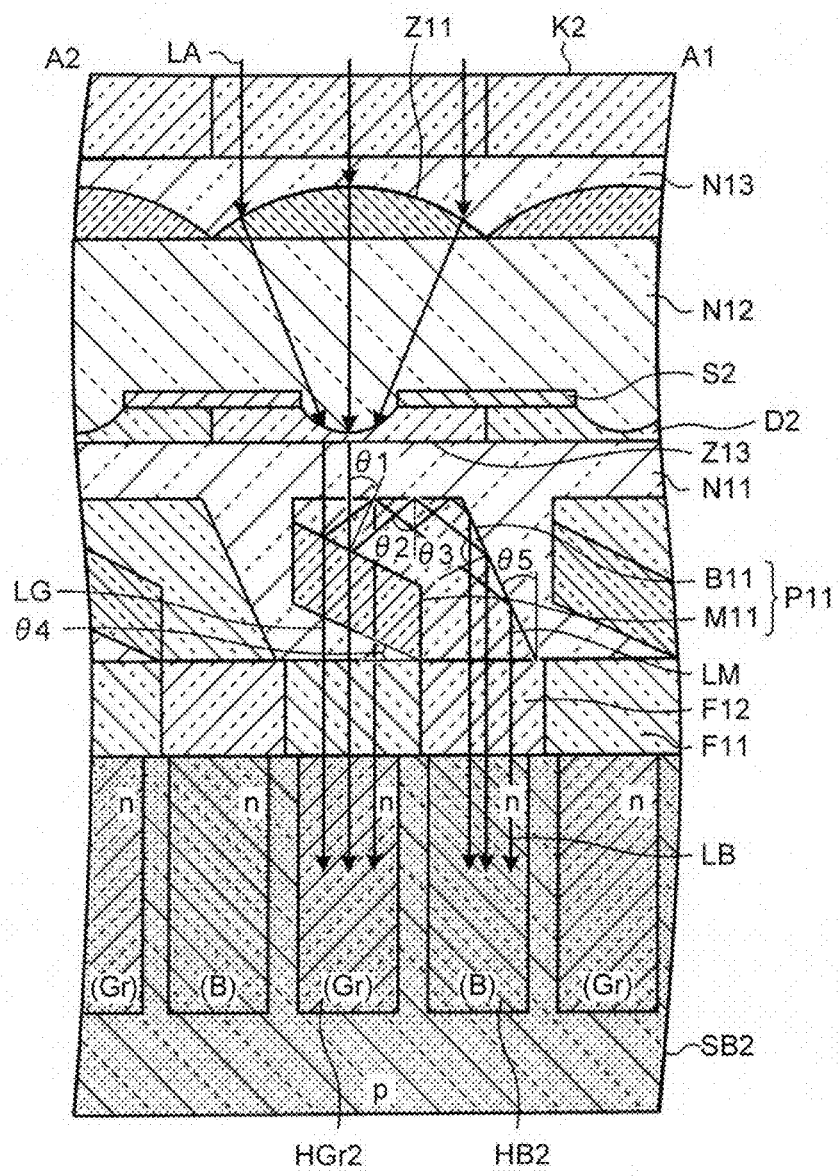
FIG. 8 is a cross-sectional view illustrating an example of the configuration of pixel cells in the A1-A2 direction of FIG. 3 in a solid-state imaging device according to a second embodiment.
Figure 9:
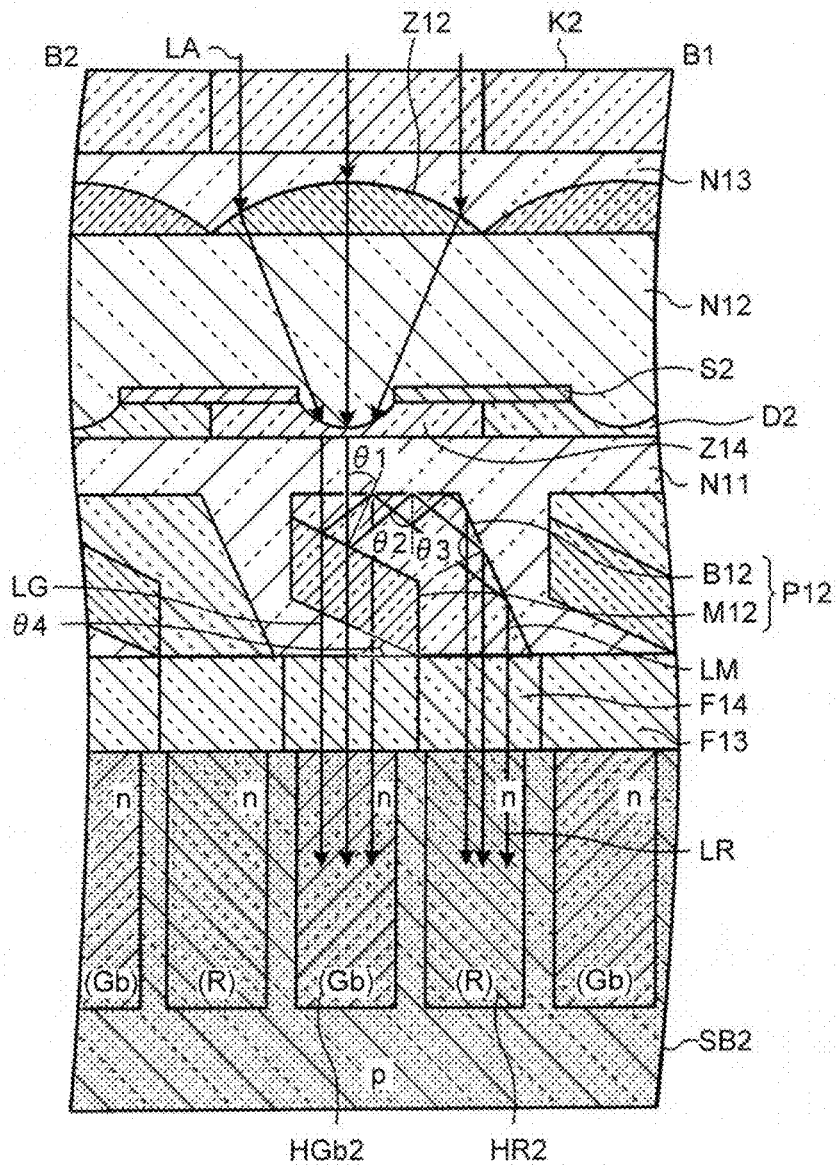
FIG. 9 is a cross-sectional view illustrating an example of the configuration of pixel cells in the B1-B2 direction of FIG. 3 in a solid-state imaging device according to the second embodiment.

FIG. 8 is a cross-sectional view illustrating an example of the configuration of the pixel cells in the A1-A2 direction of FIG. 3 in a solid-state imaging device according to a second embodiment and FIG. 9 is a cross-sectional view illustrating an example of the configuration of the pixel cells in the B1-B2 direction of FIG. 3 in a solid-state imaging device according to the second embodiment.

In FIG. 8 and FIG. 9, a semiconductor layer SB2 is formed with the photoelectric conversion layer R for red, the photoelectric conversion layers Gr and Gb for green, and the photoelectric conversion layer B for blue. The photoelectric conversion layer R for red, the photoelectric conversion layers Gr and Gb for green, and the photoelectric conversion layer B for blue are arranged in a Bayer arrangement. Further, an impurity diffusion layer HR2 is formed in the photoelectric conversion layer R for red and an impurity diffusion layer HB2 is formed in the photoelectric conversion layer B for blue. An impurity diffusion layer HGr2 is formed in the photoelectric conversion layer Gr for green and an impurity diffusion layer HGb2 is formed in the photoelectric conversion layer Gb for green.

A green filter F11 and a blue filter F12 are provided on the photoelectric conversion layer Gr for green and the photoelectric conversion layer B for blue, respectively, and a green filter F13 and a red filter F14 are provided on the photoelectric conversion layer Gb for green and the photoelectric conversion layer R for red, respectively. The color filters such as the green filters F11 and F13, the blue filter F12, and the red filter F14 can be formed by containing a pigment or a dyestuff in the transparent film.

Over the green filter F11 and on the blue filter F12, a color separation element P11 is disposed for a pair of the photoelectric conversion layer B for blue and the photoelectric conversion layer Gr for green in the column direction CD. Over the green filter F13 and on the red filter F14, a color separation element P12 is disposed for a pair of the photoelectric conversion layer R for red and the photoelectric conversion layer Gb for green in the column direction CD. The color separation elements P11 and P12 are able to transmit the green light LG and guide it to the green filters F11 and F13, respectively, while reflect the blue light LB and the red light LR and guide them to the blue filter F12 and the red filter F14, respectively.

The color separation elements P11 and P12 are provided with dichroic filters M11 and M12 and reflection blocks B11 and B12, respectively. The dichroic filters M11 and M12 are able to transmit the green light LG and reflect the blue light LB and the red light LR. The reflection blocks B11 and B12 support the dichroic filters M11 and M12 and are able to guide the reflection lights reflected by the dichroic filters M11 and M12 to the blue filter F12 and the red filter F14, respectively. The dichroic filters M11 and M12 are disposed over the green filters F11 and F13, respectively. The bottom surfaces of the reflection blocks B11 and B12 are disposed on the blue filter F12 and the red filter F14, respectively, such that the reflection blocks B11 and B12 protrude on the dichroic filters M11 and M12. The reflection blocks B11 and B12 are provided with two reflection surfaces and adapted to guide the reflection lights reflected by the dichroic filters M11 and M12 to the blue filter F12 and the red filter F14, respectively, by two-time internal reflections. An interlayer insulating film N11 is formed on the color separation elements P11 and P12 so as to surround the dichroic filters M11 and M12 and the reflection blocks B11 and B12. It is noted that the dichroic filters M11 and M12 and the reflection blocks B11 and B12 can be configured in the same manner as the dichroic filters M1 and M2 and the reflection blocks B1 and B2 of FIG. 3 to FIG. 5.

A dielectric layer D2 is laminated on the interlayer insulating film N11, and the dielectric layer D2 is provided with in-layer lenses Z13 and Z14 for the color separation elements P11 and P12, respectively. It is noted that the in-layer lenses Z13 and Z14 may be disposed over the dichroic filters M11 and M12, respectively. The in-layer lenses Z13 and Z14 are able to convert the incident light into a parallel light. A light shielding layer S2 is formed on the dielectric layer D2 so as to avoid the in-layer lenses Z13 and Z14. An interlayer insulating film N12 is formed on the in-layer lenses Z13 and Z14 and the light shielding layer S2.

Micro-lenses Z11 and Z12 are disposed on the interlayer insulating film N12. It is noted that the condensation area of each of the micro-lenses Z11 and Z12 may be set as large as two pixels. The micro-lenses Z11 and Z12 can be configured in the same manner as the micro-lenses Z1 and Z2 of FIG. 3 to FIG. 5.

An interlayer insulating film N13 is formed on the micro-lenses Z11 and Z12. A refraction plate K2 is formed on the interlayer insulating film N13. It is noted that the refraction plate K2 is able to convert the incident light into a vertical light. The refraction plate K2 can be configured in the same manner as the refraction plate K1 of FIG. 4 and FIG. 5.

After converted into the vertical lights at the refraction plate K2, the incident lights LA are condensed by the microlenses Z11 and Z12, and enter the in-layer lenses Z13 and Z14, respectively. Further, after converted into the parallel lights at the in-layer lenses Z13 and Z14, the incident lights LA enter the dichroic filters M11 and M12, respectively.

Then, at the dichroic filter M11, the green light LG is transmitted while the magenta light LM (the blue light LB and the red light LR) is reflected. The green light LG then enters the photoelectric conversion layer Gr for green through the green filter F11 and the green light is therefore photoelectric-converted, and the charges generated at this time are accumulated in the photoelectric conversion layer Gr for green. Further, the magenta light LM reflected by the dichroic filter M11 is total-reflected twice inside the reflection block B11 and thus converted into the vertical light above the blue filter F12 and enters the blue filter F12. Then, the blue light LB is transmitted through the blue filer F12, enters the photoelectric conversion layer B for blue and thus is photoelectric-converted, and the charges generated at this time are accumulated in the photoelectric conversion layer B for blue.

On the other hand, at the dichroic filter M12, the green light LG is transmitted while the magenta light LM (the blue light LB and the red light LR) is reflected. The green light LG then enters the photoelectric conversion layer Gb for green through the green filter F13 and the green light is therefore photoelectric-converted, and the charges generated at this time are accumulated in the photoelectric conversion layer Gb for green. Further, the magenta light LM reflected by the dichroic filter M12 is total-reflected twice inside the reflection block B12 and thus converted into the vertical light above the red filter F14 and enters the red filter F14. Then, the red light LR is transmitted through the red filer F14, enters the photoelectric conversion layer R for red and thus is photoelectric-converted, and the charges generated at this time are accumulated in the photoelectric conversion layer R for red.

The lights that have been color-separated by the color separation elements P11 and P12 are further color-separated by the color filters, so that the incident light can be separated into three primary colors by one-time color separation at the color separation elements P11 and P12. This allows for the improved sensitivity that is twofold compared to the manner in which the incident light LA is separated into three primary colors by using the color filter only, and allows for the improved color reproducibility compared to the manner in which two-time color separations are made by the color separation elements P11 and P12. Further, according to the manner in which the lights that have been color-separated by the color separation elements P11 and P12 are further color-separated by the color filters, the complicated manufacturing process of the color separation elements P11 and P12 can be done in one process, so that the manufacturing cost can be reduced compared to the manner in which two-time color separations are made by the color separation elements P11 and P12.

Furthermore, the angle of incidence θ1 is set to be within the range of 20 to 30 degrees, which allows for the reduced polarization at the dichroic filters M11 and M12. This prevents the situation that the transmission characteristics and the reflection characteristics are greatly different between the P wave that is parallel to the incidence surfaces of the dichroic filters M11 and M12 and the S wave that is orthogonal to the incidence surfaces of the dichroic filters M11 and M12, so that the color separation characteristics can be improved.

Further, the color filters are disposed under the color separation elements P11 and P12, so that the incident lights LA can enter the in-layer lenses Z13 and Z14 with no diffusion of color due to the color filter. This allows for the improved condensing rate at the in-layer lenses Z13 and Z14 and the improved color separation of the color filter.

Third Embodiment

Figure 10:
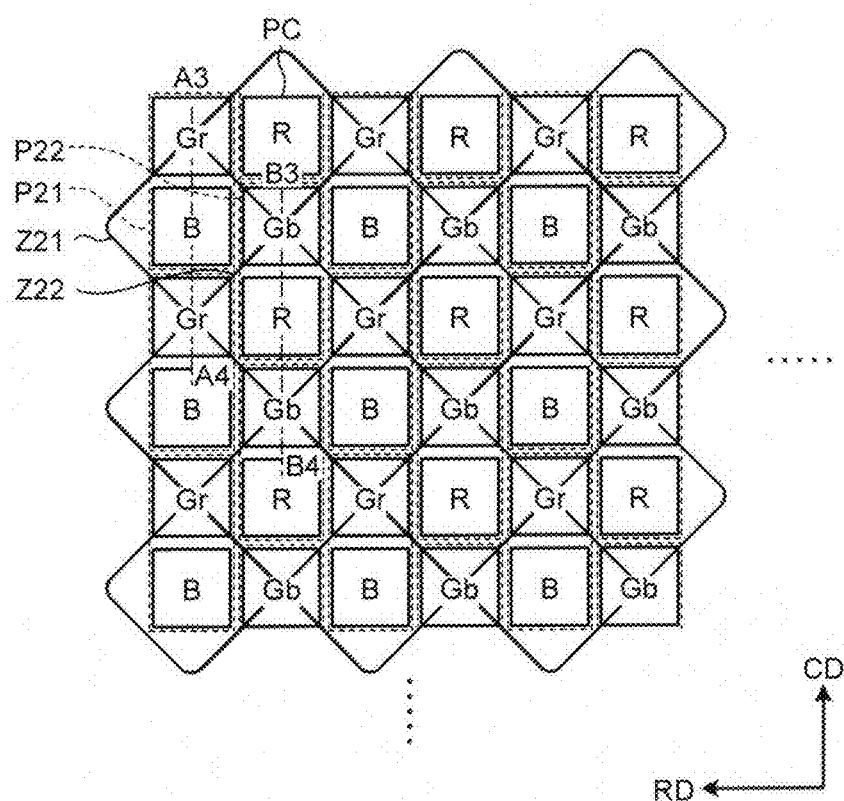
FIG. 10 is a plane view illustrating an example of the arrangement of pixel cells of a solid-state imaging device according to a third embodiment.
Figure 11:
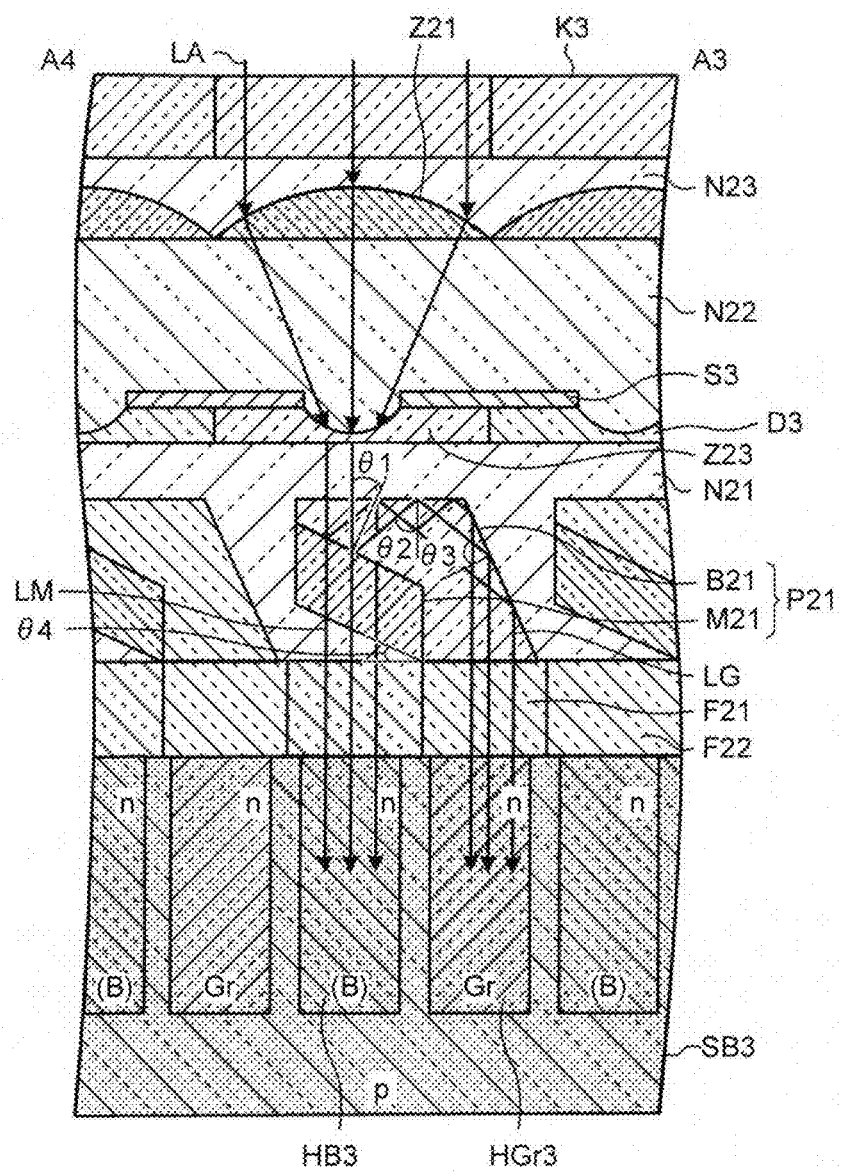
FIG. 11 is a cross-sectional view illustrating an example of the configuration taken along a line A3-A4 of FIG. 10.
Figure 12:
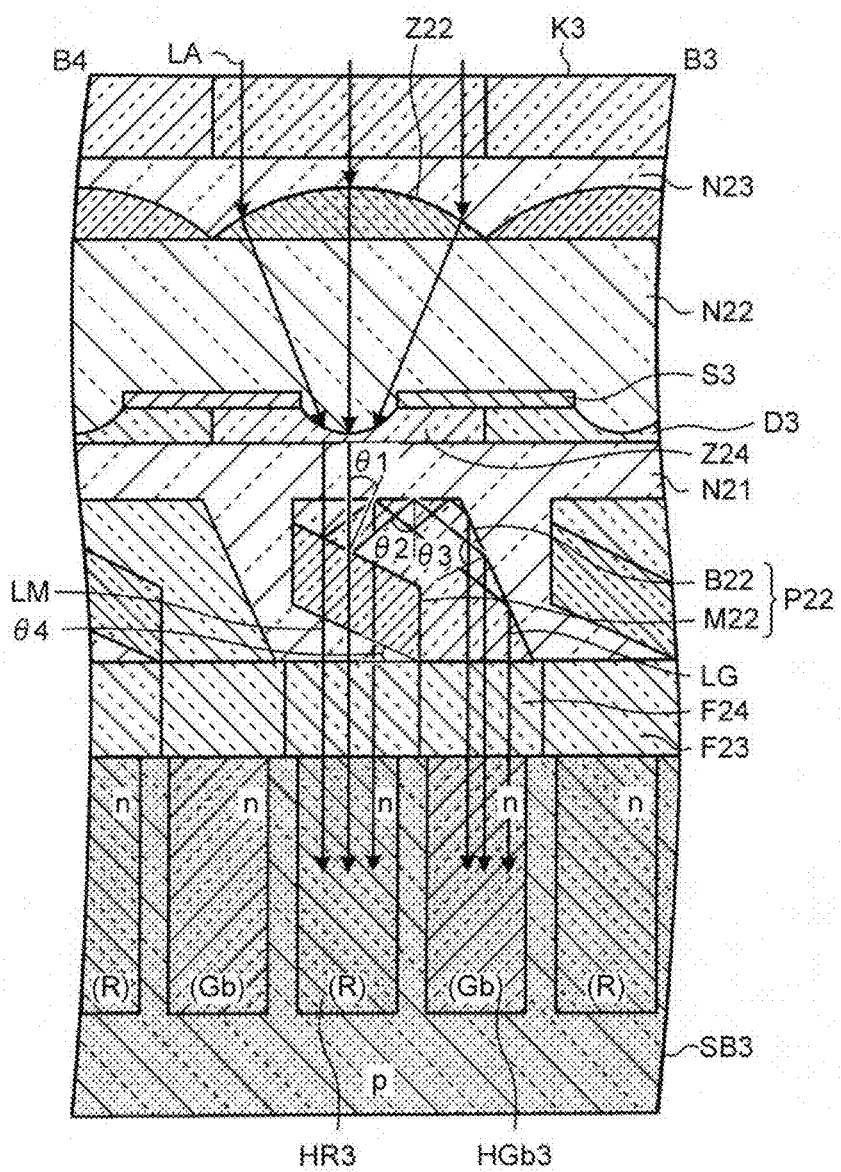
FIG. 12 is a cross-sectional view illustrating an example of the configuration taken along a line B3-B4 of FIG. 10.

FIG. 10 is a plane view illustrating an example of the arrangement of pixel cells of a solid-state imaging device according to the third embodiment, FIG. 11 is a cross-sectional view illustrating an example of the configuration taken along a line A3-A4 of FIG. 10, and FIG. 12 is a cross-sectional view illustrating an example of the configuration taken along a line B3-B4 of FIG. 10.

In FIG. 10 to FIG. 12, a semiconductor layer SB3 is formed with the photoelectric conversion layer R for red, the photoelectric conversion layers Gr and Gb for green, and the photoelectric conversion layer B for blue. The photoelectric conversion layer R for red, the photoelectric conversion layers Gr and Gb for green, and the photoelectric conversion layer B for blue are arranged in the Bayer arrangement. Further, an impurity diffusion layer HR3 is formed in the photoelectric conversion layer R for red and an impurity diffusion layer HB3 is formed in the photoelectric conversion layer B for blue. An impurity diffusion layer HGr3 is formed in the photoelectric conversion layer Gr for green and an impurity diffusion layer HGb3 is formed in the photoelectric conversion layer Gb for green.

A green filter F21 and a blue filter F22 are provided on the photoelectric conversion layer Gr for green and the photoelectric conversion layer B for blue, respectively, and a green filter F23 and a red filter F24 are provided on the photoelectric conversion layer Gb for green and the photoelectric conversion layer R for red, respectively. The color filters such as the green filters F21 and F23, the blue filter F22, and the red filter F24 can be formed by containing a pigment or a dyestuff in the transparent film.

On the green filter F21 and over the blue filter F22, a color separation element P21 is disposed for a pair of the photoelectric conversion layer B for blue and the photoelectric conversion layer Gr for green in the column direction CD. Over the green filter F23 and on the red filter F24, a color separation element P22 is disposed for a pair of the photoelectric conversion layer R for red and the photoelectric conversion layer Gb for green in the column direction CD. The color separation elements P21 and P22 area able to transmit the blue light LB and the red light LR and guide them to the blue filter F22 and the red filter F24, respectively, while reflect the green light LG and guide it to the green filters F21 and F23, respectively.

The color separation elements P21 and P22 are provided with dichroic filters M21 and M22 and reflection blocks B21 and B22, respectively. The dichroic filters M21 and M22 are able to transmit the blue light LB and the red light LR and reflect the green light LG. The reflection blocks B21 and B22 support the dichroic filters M21 and M22 and are able to guide the reflection lights reflected by the dichroic filters M21 and M22 to the green filters F21 and F23, respectively. The dichroic filters M21 and M22 are disposed over the blue filter F22 and the red filter F24, respectively. The bottom surfaces of the reflection blocks B21 and B22 are disposed on the green filters F21 and F23, respectively, such that the reflection blocks B21 and B22 protrude on the dichroic filters M21 and M22. The reflection blocks B21 and B22 are provided with two reflection surfaces and adapted to guide the reflection lights reflected by the dichroic filters M21 and M22 to the green filters F21 and F23, respectively, by two-time internal reflections. An interlayer insulating film N21 is formed on the color separation elements P21 and P22 so as to surround the dichroic filters M21 and M22 and the reflection blocks B21 and B22. It is noted that the dichroic filters M21 and M22 and the reflection blocks B21 and B22 may be configured in the same manner as the dichroic filters M1 and M2 and the reflection blocks B1 and B2 of FIG. 3 to FIG. 5.

A dielectric layer D3 is laminated on the interlayer insulating film N21, and the dielectric layer D3 is provided with in-layer lenses Z23 and Z24 for the color separation elements P21 and P22, respectively. It is noted that the in-layer lenses Z23 and Z24 may be disposed over the dichroic filters M21 and M22, respectively. The in-layer lenses Z23 and Z24 are able to convert the incident light into a parallel light. A light shielding layer S3 is formed on the dielectric layer D3 so as to avoid the in-layer lenses Z23 and Z24. An interlayer insulating film N22 is formed on the in-layer lenses Z23 and Z24 and the light shielding layer S3.

Micro-lenses Z21 and Z22 are disposed on the interlayer insulating film N22. It is noted that the condensation area of each of the micro-lenses Z21 and Z22 may be set as large as two pixels. The micro-lenses Z21 and Z22 can be configured in the same manner as the micro-lenses Z1 and Z2 of FIG. 3 to FIG. 5.

An interlayer insulating film N23 is formed on the micro-lenses Z21 and Z22. A refraction plate K3 is formed on the interlayer insulating film N23. It is noted that the refraction plate K3 is able to convert the incident light into a vertical light. The refraction plate K3 can be configured in the same manner as the refraction plate K1 of FIG. 4 and FIG. 5.

After converted into the vertical light by the refraction plate K3, the incident light LA is condensed by the micro-lenses Z21 and Z22, and enters the in-layer lenses Z23 and Z24, respectively. Further, after converted into the parallel light at the in-layer lenses Z23 and Z24, the incident light LA enters the dichroic filters M21 and M22, respectively.

Then, at the dichroic filter M21, the magenta light LM is transmitted while the green light LG is reflected. The magenta light LM then enters the blue filter F22 and the blue light is thus transmitted. Then, the blue light LB enters the photoelectric conversion layer B for blue and is therefore photoelectric-converted, and the charges generated at this time are accumulated in the photoelectric conversion layer B for blue. Further, the green light LG reflected by the dichroic filter M21 is total-reflected twice inside the reflection block B21 and thus converted into the vertical light above the green filter F21, enters the photoelectric conversion layer Gr through the green filter F21 and is therefore photoelectric-converted, and the charges generated at this time are accumulated in the photoelectric conversion layer Gr for green.

On the other hand, at the dichroic filter M22, the magenta light LM is transmitted while the green light LG is reflected. The magenta light LM then enters the red filter F24 and the red light is thus transmitted. Then, red light LR enters the photoelectric conversion layer R for red and is therefore photoelectric-converted, and the charges generated at this time are accumulated in the photoelectric conversion layer R for red. Further, the green light LG reflected by the dichroic filter M22 is total-reflected twice inside the reflection block B22 and thus converted into the vertical light above the green filter F23, enters the photoelectric conversion layer Gb through the green filter F23 and is therefore photoelectric-converted, and the charges generated at this time are accumulated in the photoelectric conversion layer Gb for green.

The lights that have been color-separated by the color separation elements P21 and P22 are further color-separated by the color filters, so that the incident light can be separated into three primary colors by one-time color separation at the color separation elements P21 and P22. This allows for the improved sensitivity that is twofold compared to the manner in which the incident light LA is separated into three primary colors by using the color filter only, and allows for the improved color reproducibility compared to the manner in which two-time color separations are made by the color separation elements P21 and P22. Further, according to the manner in which the lights that have been color-separated by the color separation elements P21 and P22 are further color-separated by the color filters, the complicated manufacturing process of the color separation elements P21 and P22 can be done in one process, so that the manufacturing cost can be reduced compared to the manner in which two-time color separations are made by the color separation elements P21 and P22.

Furthermore, the angle of incidence $\theta 1$ is set to be within the range of 20 to 30 degrees, which allows for the reduced polarization at the dichroic filters M21 and M22. This prevents the situation that the transmission characteristics and the reflection characteristics are greatly different between the P wave that is parallel to the incidence surfaces of the dichroic filters M21 and M22 and the S wave that is orthogonal to the incidence surfaces of the dichroic filters M21 and M22, so that the color separation characteristics can be improved.

Further, the color filters are disposed under the color separation elements P21 and P22, so that the incident light LA can enter the in-layer lenses Z23 and Z24 with no diffusion of color due to the color filter. This allows for the improved condensing rate at the in-layer lenses Z23 and Z24 and the improved color separation of the color filter.

Fourth Embodiment

Figure 13:
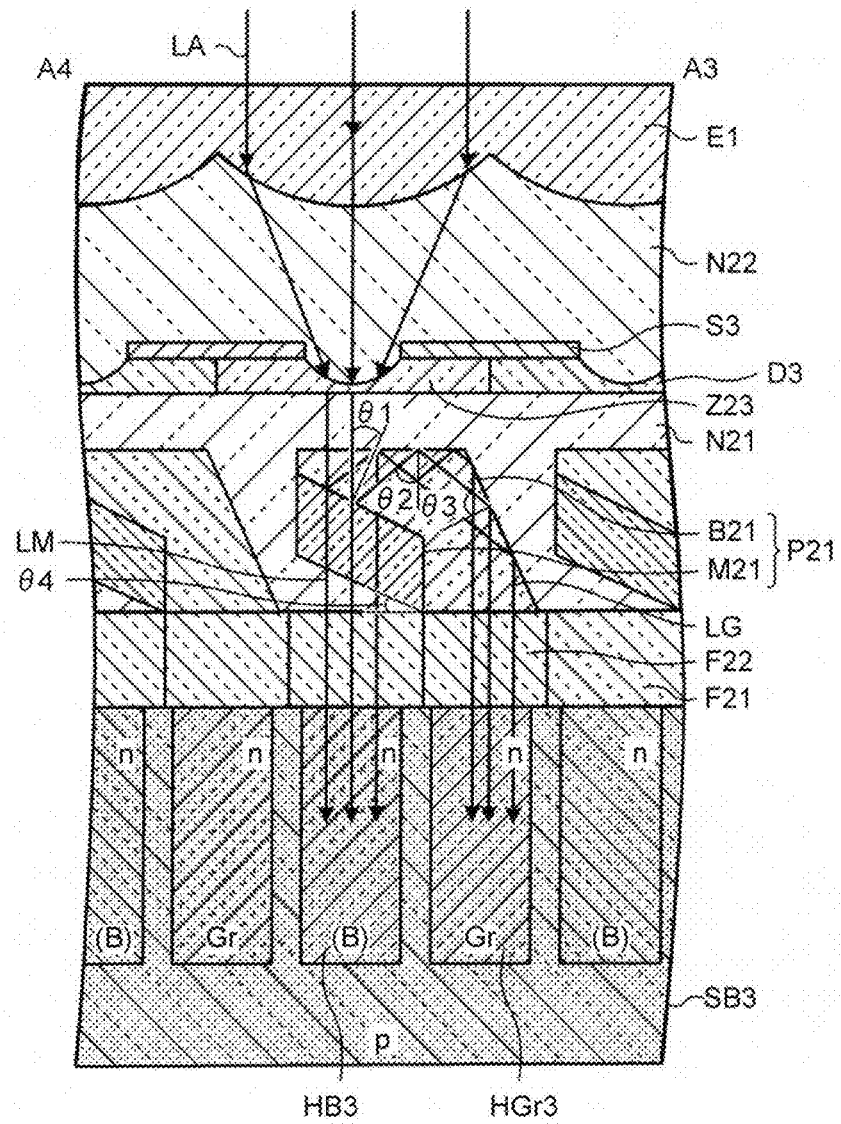
FIG. 13 is a cross-sectional view illustrating an example of the configuration of pixel cells in the A3-A4 direction of FIG. 10 in a solid-state imaging device according to a fourth embodiment.

FIG. 13 is a cross-sectional view illustrating an example of the configuration of pixel cells in the A3-A4 direction of FIG. 10 in a solid-state imaging device according to the fourth embodiment.

In FIG. 13, in the fourth embodiment, a refractive micro-lens E1 is provided in place of the micro-lens Z21, the interlayer insulating film N23, and the refractive plate K3 of FIG. 11. The micro-lens Z21 and the reflective plate K3 of FIG. 11 are integrated into the refractive micro-lens E1. It is noted that titanium oxide ($TiO_2$) may be used for the refractive micro-lens E1. Here, the use of the refractive micro-lens E1 in place of the micro-lens Z21, the interlayer insulating film N23, and the refraction plate K3 allows for the reduced number of processes. It is noted that, also for the configuration of FIG. 12, the refractive micro-lens E1 may be used in place of the micro-lens Z22, the interlayer insulating film N23, and the refraction plate K3.

Figure 14:
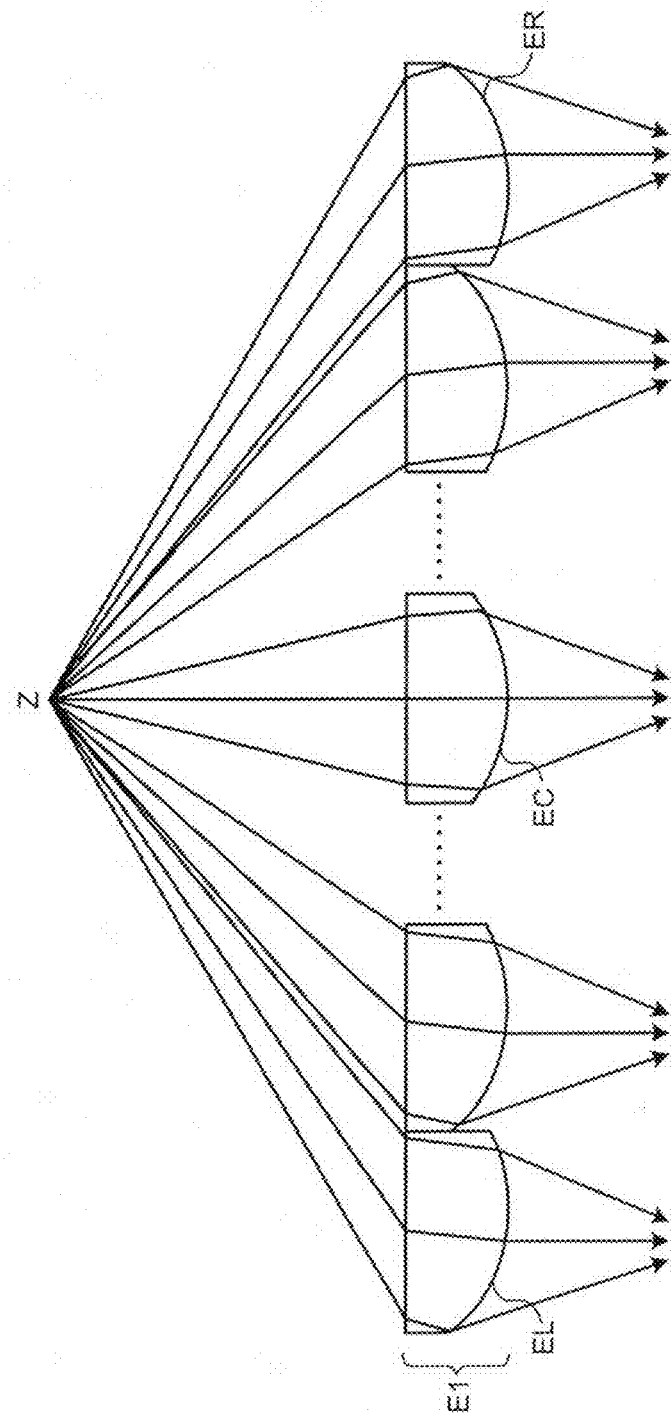
FIG. 14 is a cross-sectional view illustrating an example of the configuration from the right end to the left end of a screen in a refractive micro-lens E1 of FIG. 13.

FIG. 14 is a cross-sectional view illustrating an example of the configuration from the right end to the left end of a screen in the refractive micro-lens E1 of FIG. 13.

In FIG. 14, the refractive micro-lens E1 is provided with lens surfaces having different angles of inclination from the center toward the ends. A center lens surface EC has the angle of inclination set to 0 degree, the angle of inclination increases from the center toward the ends, and a left end lens surface EL and a right end lens surface ER have the largest angle of inclination.

The incident light LA condensed by a condensing lens Z is converted into the vertical light while being condensed by the refractive micro-lens E1. In this case, at the lens surface EC, the vertical incident light is condensed and then radiated vertically. At the lens surfaces EL and ER, the oblique incident light is condensed and then radiated vertically.

The use of such refractive micro-lens E1 allows for substantially the vertical incidence to an in-layer lens Z23 even if the angle of incidence of the incident light LA decreases from the center toward the ends of the refractive micro-lens E1, so that the stable color reproducibility can be achieved over the entire area of the screen.

Fifth Embodiment

Figure 15:
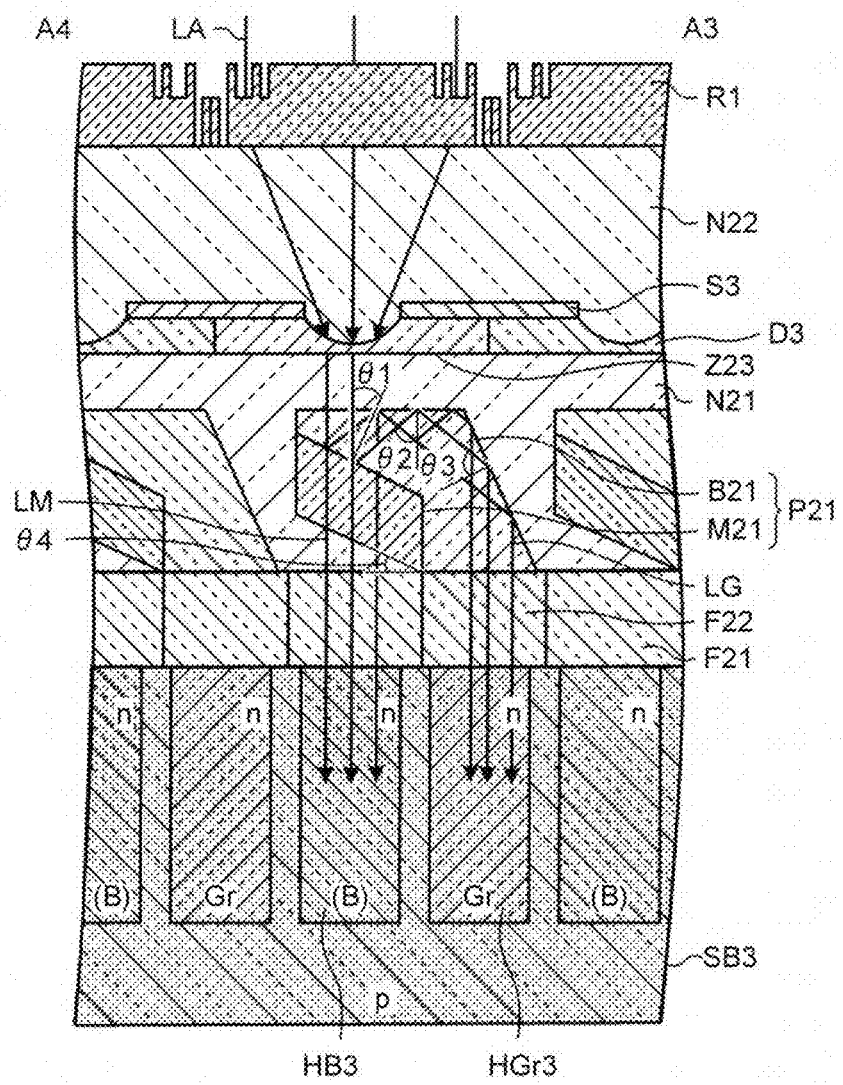
FIG. 15 is a cross-sectional view illustrating an example of the configuration of pixel cells in the A3-A4 direction of FIG. 10 in a solid-state imaging device according to a fifth embodiment.

FIG. 15 is a cross-sectional view illustrating an example of the configuration of pixel cells in the A3-A4 direction of FIG. 10 in a solid-state imaging device according to a fifth embodiment.

In FIG. 15, according to the fifth embodiment, a diffractive lens R1 is provided in place of the refractive micro-lens E1 of FIG. 13. It is noted that titanium oxide ($TiO_2$) may be used for the diffractive lens R1. Here, the use of the diffractive lens R1 in place of the micro-lens Z21, the interlayer insulating film N23, and the refraction plate K3 allows for the reduced number of the manufacturing processes.

Figure 16:
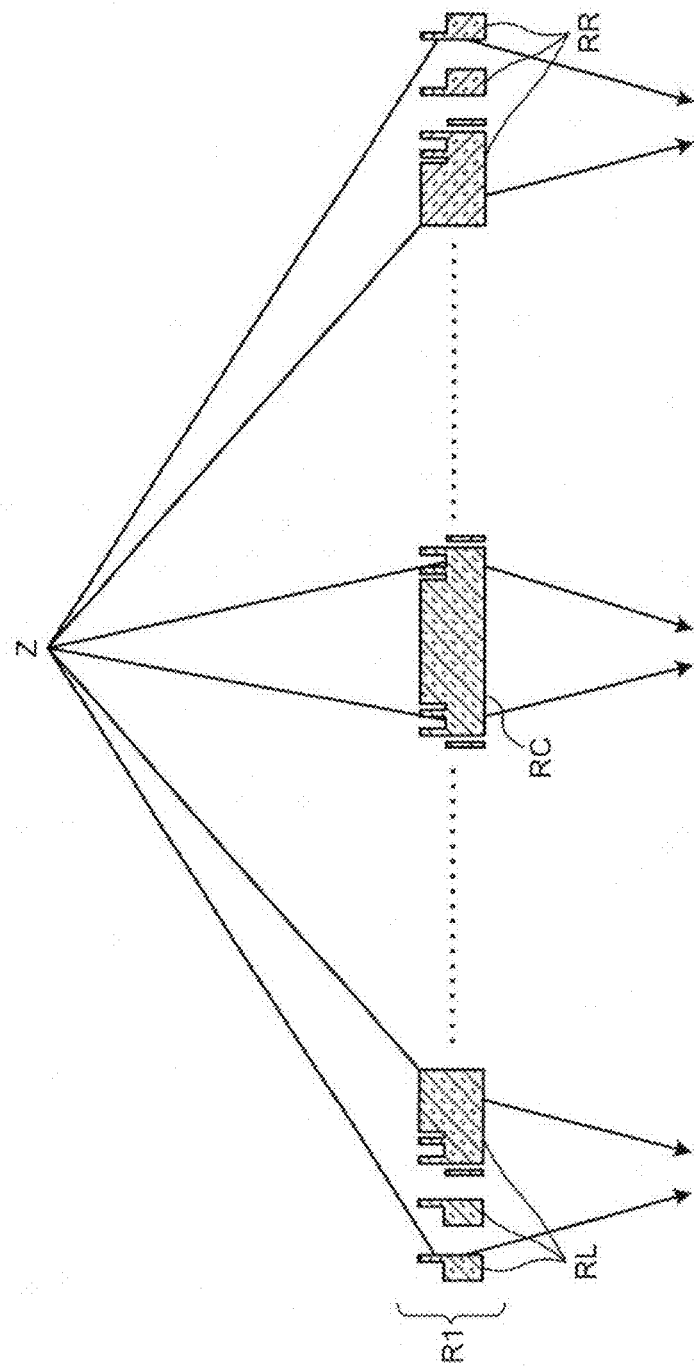
FIG. 16 is a cross-sectional view illustrating an example of the configuration from the right end to the left end of a screen in a diffractive lens R1 of FIG. 15.

FIG. 16 is a cross-sectional view illustrating an example of the configuration from the right end to the left end of a screen in the diffractive lens R1 of FIG. 15.

In FIG. 16, the diffractive lens R1 is provided with a diffraction pattern having different angles of diffraction from the center toward the ends. A center diffraction pattern RC has the angle of diffraction set to 0 degree, the angle of diffraction increases from the center toward the ends, and a left end diffraction pattern RL and a right end diffraction pattern RR have the largest angle of diffraction.

The incident light LA condensed by the condensing lens Z is converted into the vertical light while being condensed by the diffractive lens R1. In this case, at the diffraction pattern RC, the vertical incident light is condensed and then radiated vertically. At the diffractive lenses RL and RR, the oblique incident light is condensed and then radiated vertically.

The use of such diffractive lens R1 allows for substantially the vertical incidence to the in-layer lens Z23 even if the angle of incidence of the incident light LA decreases from the center toward the ends of the diffractive lens R1, so that the stable color reproducibility can be achieved over the entire area of the screen.

Sixth Embodiment

Figure 17:
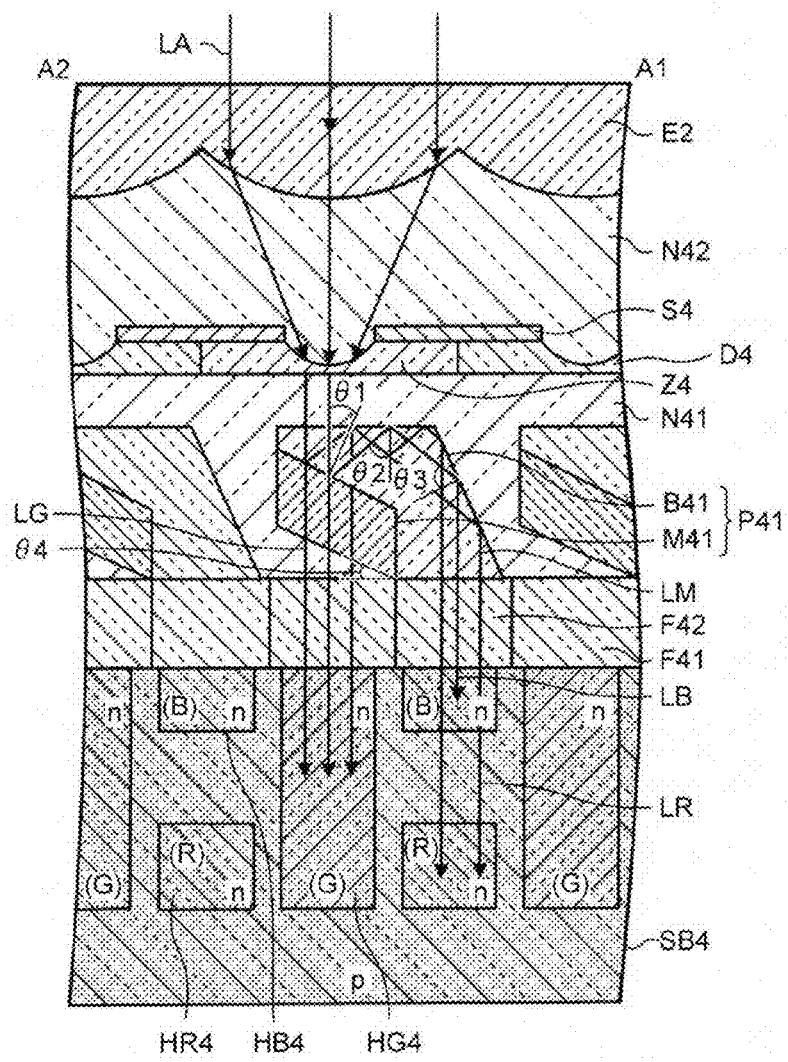
FIG. 17 is a cross-sectional view illustrating an example of the configuration of pixel cells in the A1-A2 direction of FIG. 3 in a solid-state imaging device according to a sixth embodiment.

FIG. 17 is a cross-sectional view illustrating an example of the configuration of pixel cells in the A1-A2 direction of FIG. 3 in a solid-state imaging device according to the sixth embodiment.

In FIG. 17, a semiconductor layer SB4 is formed with a photoelectric conversion layer R for red, a photoelectric conversion layer G for green, and a photoelectric conversion layer B for blue. Here, the photoelectric conversion layer G for green may be disposed at the same positions as the photoelectric conversion layers Gr and Gb of FIG. 3. The photoelectric conversion layer R for red and the photoelectric conversion layer B for blue may be disposed overlapping in the depth direction at the positions of the photoelectric conversion layer R for red and the photoelectric conversion layer B for blue of FIG. 3.

Here, an impurity diffusion layer HR4 is formed in the photoelectric conversion layer R for red, an impurity diffusion layer HB4 is formed in the photoelectric conversion layer B for blue, and an impurity diffusion layer HG4 is formed in the photoelectric conversion layer G for green. The impurity diffusion layer HB4 is disposed overlapping the impurity diffusion layer HR4. A magenta filter F42 is provided on the photoelectric conversion layer B for blue, and a green filter F41 is provided on the photoelectric conversion layer G for green.

Over the green filter F41 and on the magenta filter F42, a color separation element P41 is disposed for a pair of the photoelectric conversion layer B for blue, the photoelectric conversion layer G for green, and the photoelectric conversion layer R for red in the column direction CD. The color separation element P41 is able to transmit the green light LG and guide it to the photoelectric conversion layer G, while reflect the blue light LB and the red light LR and guide them to the photoelectric conversion layer B for blue and the photoelectric conversion layer R for red.

The color separation element P41 is provided with a dichroic filter M41 and a reflection block B41. The dichroic filter M41 is able to transmit the green light LG and reflect the blue light LB and the red light LR. The reflection block B41 supports the dichroic filter M41 and is able to guide the reflection light reflected by the dichroic filter M41 to the photoelectric conversion layer B for blue and the photoelectric conversion layer R for red. The dichroic filter M41 is disposed over the photoelectric conversion layer G for green. The bottom surface of the reflection block B41 is disposed on the photoelectric conversion layer B for blue such that the reflection block B41 protrudes on the dichroic filter M41. The reflection block B41 is provided with two reflection surfaces and adapted to guide the reflection light reflected by the dichroic filter M41 to the photoelectric conversion layer B for blue and the photoelectric conversion layer R for red by two-time internal total-reflections. An interlayer insulating film N41 is formed on the color separation element P41 so as to surround the dichroic filter M41 and the reflection block B41. It is noted that the dichroic filter M41 and the reflection block B41 can be configured in the same manner as the dichroic filter M1 and the reflection block B1 of FIG. 4.

A dielectric layer D4 is laminated on the interlayer insulating film N41, and the dielectric layer D4 is provided with an in-layer lens Z4 for each color separation element P41. It is noted that the in-layer lens Z4 may be disposed on each dichroic filter M41. The in-layer lens Z4 is able to convert the incident light into a parallel light. A light shielding layer S4 is formed on the dielectric layer D4 so as to avoid the in-layer lens Z4. An interlayer insulating film N42 is formed on the in-layer lens Z4 and the light shielding layer S4. A refractive micro-lens E2 is disposed on the interlayer insulating film N42.

The incident light LA is condensed by the refractive micro-lens E2 with converted into the vertical light and enters the in-layer lens Z4. Further, after converted into the parallel light by the in-layer lens Z4, the incident light LA enters the dichroic filter M41.

Then, at the dichroic filter M41, the green light LG is transmitted while the magenta light LM (the blue light LB and the red light LR) is reflected. The green light LG then enters the photoelectric conversion layer G for green through the green filter F41 and the green light is therefore photoelectric-converted, and the charges generated at this time are accumulated in the photoelectric conversion layer G for green. Further, the magenta light LM reflected by the dichroic filter M41 is total-reflected twice inside the reflection block B41 and thus converted into the vertical light above the magenta filter F42. Then, the blue light LB and the red light LR are transmitted through the magenta filer F42, enters the photoelectric conversion layer B for blue and the photoelectric conversion layer R and are therefore photoelectric-converted, and the charges generated at this time are accumulated in the photoelectric conversion layer B for blue and the photoelectric conversion layer R for red, respectively.

The lights that have been color-separated by the color separation element P41 are further color-separated in the depth direction by the photoelectric conversion layer B for blue and the photoelectric conversion layer R for red, so that the incident light can be separated into three primary colors by one-time color separation at the color separation element P41. This allows for the improved sensitivity of the green light LG that is twofold and the improved sensitivities of the blue light LB and the red light LR that is fourfold compared to the manner in which the incident light is separated into three primary colors by using the color filter only and allows for the improved color reproducibility compared to the manner in which two-time color separations are made by the color separation element P41. Further, according to the manner in which the lights that have been color-separated by the color separation element P41 are further color-separated in the depth direction by the photoelectric conversion layer B for blue and the photoelectric conversion layer R for red, the complicated manufacturing process of the color separation element P41 can be done in one process, so that the manufacturing cost can be reduced compared to the manner in which two-time color separations are made by the color separation element P41.

Furthermore, the angle of incidence θ1 is set within the range of 20 to 30 degrees, which allows for the reduced polarization at the dichroic filter M41. This prevents the situation that the transmission characteristics and the reflection characteristics are greatly different between the P wave that is parallel to the incidence surfaces of the dichroic filter M41 and the S wave that is orthogonal to the incidence surfaces of the dichroic filter M41, so that the color separation characteristics can be improved.

Further, the color filters are disposed under the color separation element P41, so that the incident light LA can enter the in-layer lens Z4 with no diffusion of color due to the color filter. This allows for the improved condensing rate at the in-layer lens Z4 and the improved color separation of the color filter.

It is noted that, although it has been exemplified in the embodiment of FIG. 17 that the green light LG is transmitted by the color separation element P41 and the blue light LB and the red light LR are reflected similarly to FIG. 8 and FIG. 9, the blue light LB and the red light LR may be transmitted and the green light may be reflected similarly to FIG. 11 and FIG. 12.

Described below will be the configuration in which the photoelectric conversion layer B for blue and the photoelectric conversion layer R for red are laminated in the depth direction. It is noted that, in the following description, although the configuration of the photoelectric conversion layers and the color filters will be indicated, the configuration of the color separation elements and the in-layer lenses on the color filters will be omitted. It is noted that the color separation elements and the in-layer lenses on the color filters may be configured similarly to those in FIG. 17.

Seventh Embodiment

Figure 18:
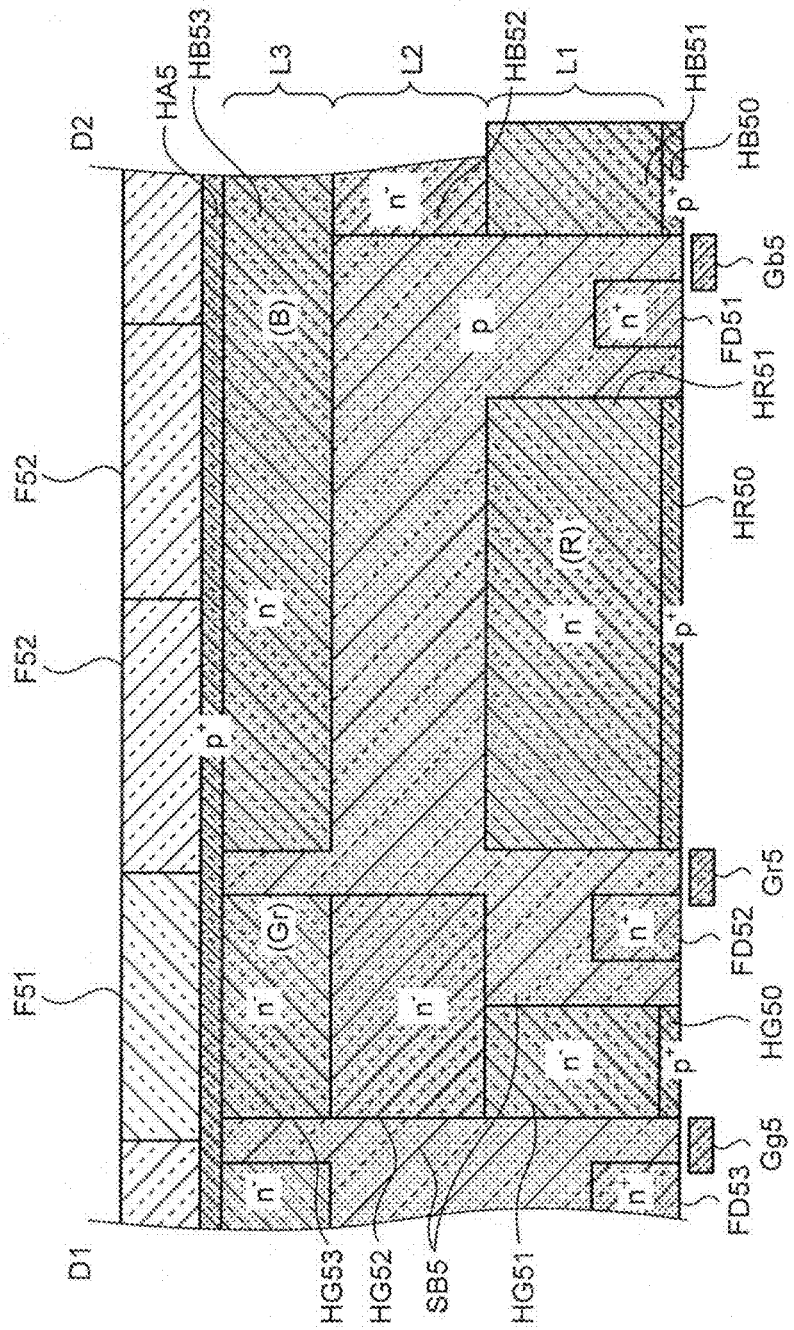
FIG. 18 is a plane view illustrating an example of the configuration of pixel cells of a solid-state imaging device according to a seventh embodiment.
Figure 19A:
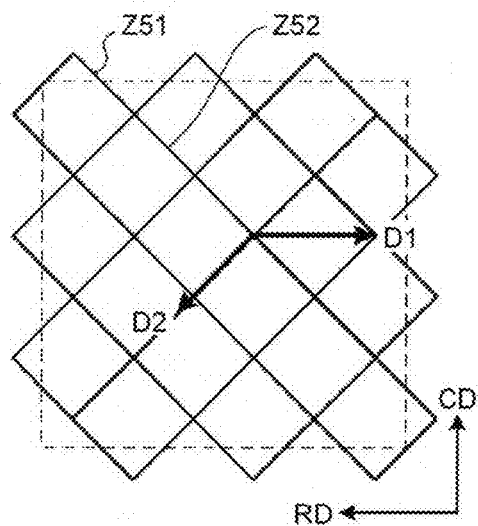
FIG. 19A is a plane view illustrating an example of the configuration of a micro-lens of the solid-state imaging device according to the seventh embodiment.
Figure 19B:
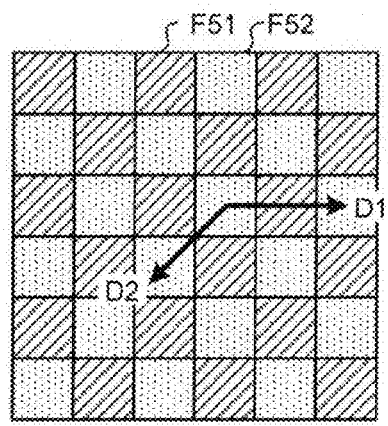
FIG. 19B is a plane view illustrating an example of the configuration of a color filter of FIG. 18.
Figure 19C:
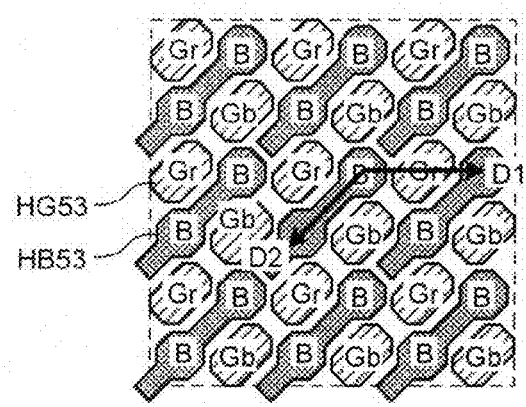
FIG. 19C is a plane view illustrating an example of the configuration of a third concentration distribution layer of FIG. 18.
Figure 19D:
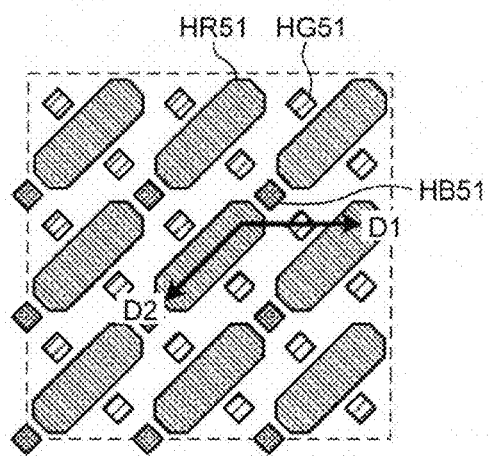
FIG. 19D is a plane view illustrating an example of the configuration of a first concentration distribution layer of FIG. 18.

FIG. 18 is a plane view illustrating an example of the configuration of pixel cells of a solid-state imaging device according to a seventh embodiment. FIG. 19A is a plane view illustrating an example of the configuration of a micro-lens of the solid-state imaging device according to the seventh embodiment, FIG. 19B is a plane view illustrating an example of the configuration of a color filter of FIG. 18, FIG. 19C is a plane view illustrating an example of the configuration of a third concentration distribution layer of FIG. 18, and FIG. 19D is a plane view illustrating an example of the configuration of a first concentration distribution layer of FIG. 18.

In FIG. 18 and FIG. 19A to FIG. 19D, a first concentration distribution layer L1, a second concentration distribution layer L2, and a third concentration distribution layer L3 are formed from the top surface side toward the back surface side in a semiconductor layer SB5. The semiconductor layer SB5 is formed with a photoelectric conversion layer R for red, photoelectric conversion layers Gr and Gb for green, and a photoelectric conversion layer B for blue.

The photoelectric conversion layers Gr and Gb for green are disposed so as not to overlap the photoelectric conversion layer R for red and the photoelectric conversion layer B for blue in the depth direction. The photoelectric conversion layer B for blue is disposed so that at least a part thereof overlaps the photoelectric conversion layer R for red in the depth direction. Further, the photoelectric conversion layer B for blue and the photoelectric conversion layers Gr and Gb for green are arranged such that the area of the back surface side of the semiconductor layer SB5 is larger than the top surface side.

Specifically, the photoelectric conversion layer B for blue is provided with impurity diffusion layers HB51 to HB53. The impurity diffusion layers HB51 to HB53 are disposed in the first concentration distribution layer L1, the second concentration distribution layer L2, and the third concentration distribution layer L3, respectively. The impurity diffusion layer HB53 is larger in area than the impurity diffusion layer HB51. It is noted that the impurity diffusion layer HB52 may have the same area as the impurity diffusion layer HB51. Further, the impurity diffusion layer HB53 may be arranged in an integral manner over two pixels neighboring in the orthogonal direction.

The photoelectric conversion layer Gr for green is provided with impurity diffusion layers HG51 to HG53. The impurity diffusion layers HG51 to HG53 are disposed in the first concentration distribution layer L1, the second concentration distribution layer L2, and the third concentration distribution layer L3, respectively. The impurity diffusion layer HG53 is larger in area than the impurity diffusion layer HG51. It is noted that the impurity diffusion layer HG52 may have the same area as the impurity diffusion layer HG53.

The photoelectric conversion layer R for red is provided with impurity diffusion layer HR51. The impurity diffusion layer HR51 is disposed in the first concentration distribution layer L1. The impurity diffusion layer HR51 is disposed such that at least a part thereof overlaps the impurity diffusion layer HB53. Further, the impurity diffusion layer HR51 may be arranged in an integral manner over two pixels neighboring in the orthogonal direction.

Further, pinning layers HB50, HR50, and HG50 are laminated on the impurity diffusion layers HB51, HR51, and HG51, respectively. A pinning layer HA5 is formed on the backside of the semiconductor layer SB5.

Further, in the top surface side of the semiconductor layer SB5, floating diffusions FD51 to FD53 are formed in the gaps among the photoelectric conversion layer R for red, the photoelectric conversion layers Gr and Gb for green, and the photoelectric conversion layer B for blue.

Further, on the semiconductor layer SB5, a gate electrode Gb5 is disposed between the photoelectric conversion layer B for blue and the floating diffusion FD51, a gate electrode Gr5 is disposed between the photoelectric conversion layer R for red and the floating diffusion FD52, and a gate electrode Gg5 is disposed between the photoelectric conversion layer Gr for green and the floating diffusion FD53.

In the back surface side of the semiconductor layer SB5, a green filter F51 and a magenta filter F52 are formed. The green filters F51 are arranged associated with the photoelectric conversion layers Gr and Gb for green. The magenta filter F52 are arranged associated with the photoelectric conversion layer B for blue and the photoelectric conversion layer R for red. Micro-lenses Z51 and Z52 are disposed over the green filter F51 and the magenta filter F52. It is noted that the condensing area of each of the micro-lenses Z51 and Z52 may be set as large as two pixels.

The green light LG transmitted by the color separation element P41 of FIG. 17 enters the photoelectric conversion layers Gr and Gb for green through the green filter F51. Then, for example, the green light is photoelectric-converted at the photoelectric conversion layer Gr for green and charges are therefore generated.

On the other hand, the blue light LB and the red light LR reflected by the color separation element P41 of FIG. 17 enter the photoelectric conversion layer B for blue and the photoelectric conversion layer R for red, respectively, through the magenta filter F52. Then, the blue light is photoelectric-converted at the photoelectric conversion layer B for blue and charges are therefore generated and accumulated in the photoelectric conversion layer B for blue. Also, the red light is photoelectric-converted at the photoelectric conversion layer R for red and charges are therefore generated and accumulated in the photoelectric conversion layer R for red.

The photoelectric conversion layer B for blue and the photoelectric conversion layer R for red are overlapped in the depth direction and the photoelectric conversion layers Gr and Gb for green are not overlapped with the photoelectric conversion layer B for blue and the photoelectric conversion layer R for red, which allows for the suppression of the reduction in the color separation characteristics of the blue light, the green light, and the red light, while increasing the receiving area of the photoelectric conversion layer B for blue and the photoelectric conversion layer R for red. This allows for the suppression of the reduction in color reproducibility while improving the sensitivity and the saturation charge amount of the pixel b for blue and the pixel r for red.

Eighth Embodiment

Figure 20:
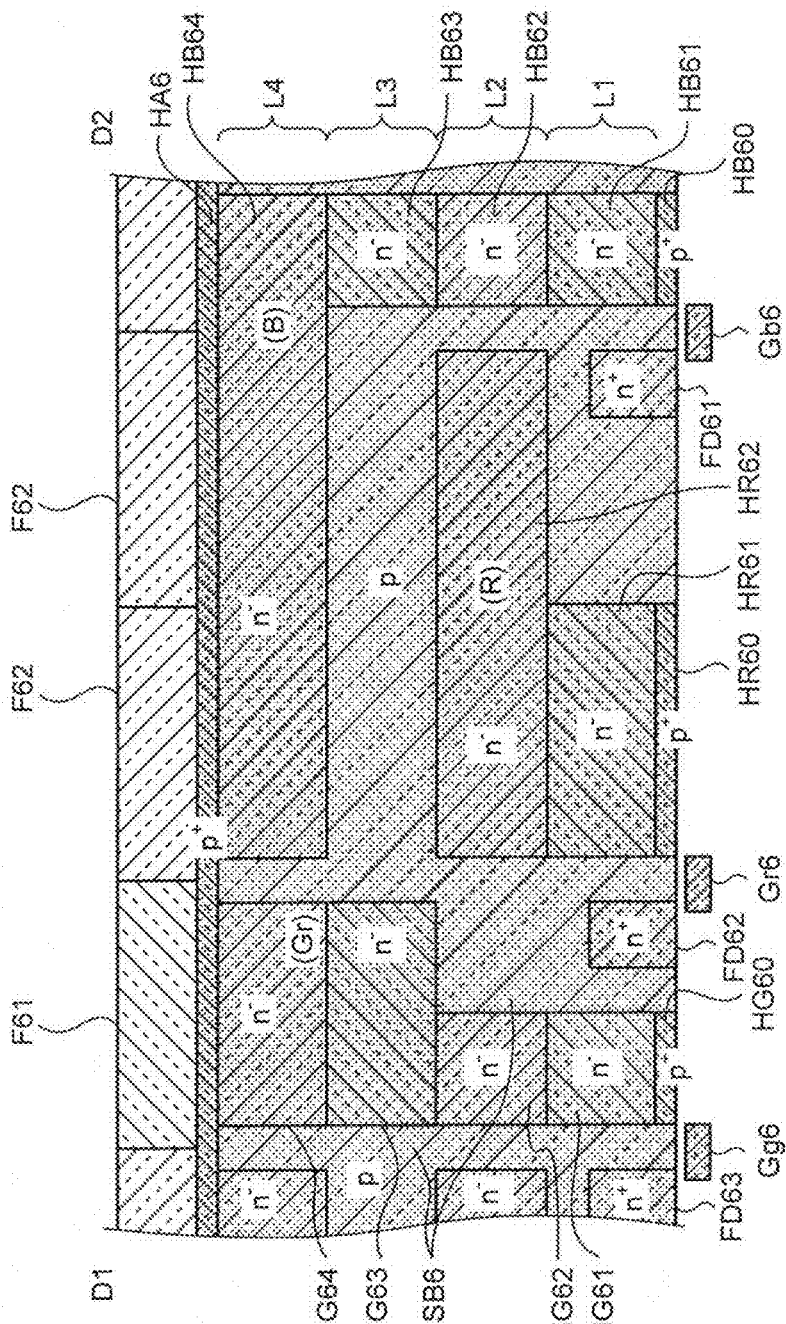
FIG. 20 is a plane view illustrating an example of the configuration of pixel cells of a solid-state imaging device according to an eighth embodiment.
Figure 21A:
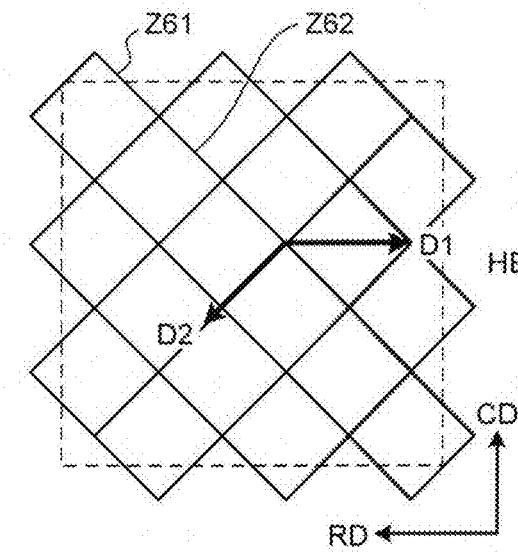
FIG. 21A is a plane view illustrating an example of the configuration of a micro-lens of the solid-state imaging device according to the eighth embodiment.
Figure 21B:
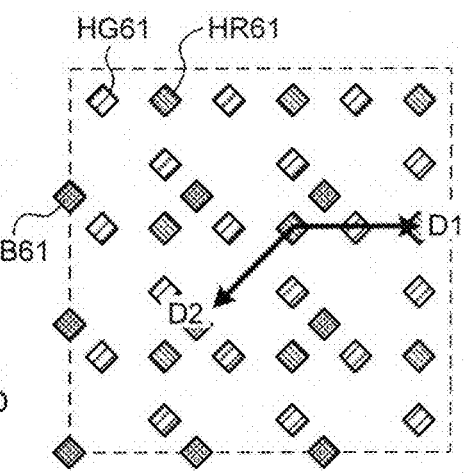
FIG. 21B is a plane view illustrating an example of the configuration of a first concentration distribution layer of FIG. 20.
Figure 21C:
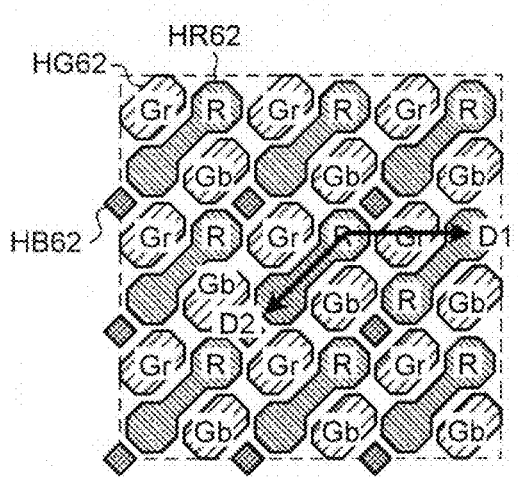
FIG. 21C is a plane view illustrating an example of the configuration of a second concentration distribution layer of FIG. 20.
Figure 21D:
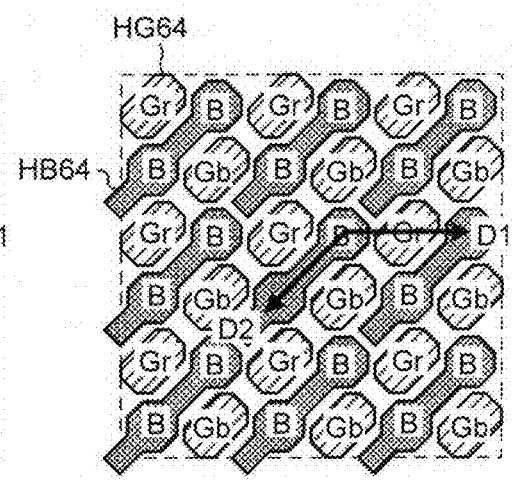
FIG. 21D is a plane view illustrating an example of the configuration of a fourth concentration distribution layer of FIG. 20.

FIG. 20 is a plane view illustrating an example of the configuration of pixel cells of a solid-state imaging device according to an eighth embodiment. FIG. 21A is a plane view illustrating an example of the configuration of a micro-lens of the solid-state imaging device according to the eighth embodiment, FIG. 21B is a plane view illustrating an example of the configuration of a first concentration distribution layer of FIG. 20, FIG. 21C is a plane view illustrating an example of the configuration of a second concentration distribution layer of FIG. 20, and FIG. 21D is a plane view illustrating an example of the configuration of a fourth concentration distribution layer of FIG. 20.

In FIG. 20 and FIG. 21A to FIG. 21D, a first concentration distribution layer L1, a second concentration distribution layer L2, a third concentration distribution layer L3, and a fourth concentration distribution layer L4 are formed from the top surface side toward the back surface side in a semiconductor layer SB6. The semiconductor layer SB6 is formed with a photoelectric conversion layer R for red, photoelectric conversion layers Gr and Gb for green, and a photoelectric conversion layer B for blue.

The photoelectric conversion layers Gr and Gb for green are disposed so as not to overlap the photoelectric conversion layer R for red and the photoelectric conversion layer B for blue in the depth direction. The photoelectric conversion layer B for blue is disposed so that at least a part thereof overlaps the photoelectric conversion layer R for red in the depth direction. Further, the photoelectric conversion layer B for blue, the photoelectric conversion layers Gr and Gb for green, and the photoelectric conversion layer R for red are arranged such that the area of the back surface side of the semiconductor layer SB6 is larger than the top surface side.

Specifically, the photoelectric conversion layer B for blue is provided with impurity diffusion layers HB61 to HB64. The impurity diffusion layers HB61 to HB64 are disposed in the first concentration distribution layer L1, the second concentration distribution layer L2, the third concentration distribution layer L3, and the fourth concentration distribution layer L4, respectively. The impurity diffusion layer HB64 is larger in area than the impurity diffusion layer HB61. It is noted that the impurity diffusion layers HB62 and HB63 may have the same area as the impurity diffusion layer HB61. Further, the impurity diffusion layer HB64 may be arranged in an integral manner over two pixels neighboring in the orthogonal direction.

The photoelectric conversion layer Gr for green is provided with impurity diffusion layers HG61 to HG64. The impurity diffusion layers HG61 to HG64 are disposed in the first concentration distribution layer L1, the second concentration distribution layer L2, the third concentration distribution layer L3, and the fourth concentration distribution layer L4, respectively. The impurity diffusion layer HG64 is larger in area than the impurity diffusion layer HG61. It is noted that the impurity diffusion layer HG63 may have the same area as the impurity diffusion layer HG64. The impurity diffusion layer HG62 may have the same area as the impurity diffusion layer HG61.

The photoelectric conversion layer R for red is provided with impurity diffusion layers HR61 and HR62. The impurity diffusion layers HR61 and HR62 are disposed in the first concentration distribution layer L1 and the second concentration distribution layer L2, respectively. The impurity diffusion layer HR62 is disposed such that at least a part thereof overlaps the impurity diffusion layer HG64 in the depth direction. Further, the impurity diffusion layer HR62 may be arranged in an integral manner over two pixels neighboring in the orthogonal direction.

It is noted that, in order to reduce the area of the impurity diffusion layer HB61 in the first concentration distribution layer L1 while ensuring the symmetry in the layout of the photoelectric conversion layers Gr and Gb for green, the impurity diffusion layer HB61 is preferably disposed between the impurity diffusion layers HG61 of the photoelectric conversion layers Gr and Gb for green as illustrated in FIG. 21B so as to be disposed offsetting to the impurity diffusion layer HR61.

Further, pinning layers HB60, HR60, and HG60 are laminated on the impurity diffusion layers HB61, HR61, and HG61, respectively. A pinning layer HA6 is formed on the backside of the semiconductor layer SB6.

Further, in the top surface side of the semiconductor layer SB6, floating diffusions FD61 to FD63 are formed in the gaps among the photoelectric conversion layer R for red, the photoelectric conversion layers Gr and Gb for green, and the photoelectric conversion layer B for blue.

Further, on the semiconductor layer SB6, a gate electrode Gb6 is disposed between the photoelectric conversion layer B for blue and the floating diffusion FD61, a gate electrode Gr6 is disposed between the photoelectric conversion layer R for red and the floating diffusion FD62, and a gate electrode Gg6 is disposed between the photoelectric conversion layer Gr for green and the floating diffusion FD63.

In the back surface side of the semiconductor layer SB6, a green filter F61 and a magenta filter F62 are formed. The green filters F61 are arranged associated with the photoelectric conversion layers Gr and Gb for green. The magenta filters F62 are arranged associated with the photoelectric conversion layer B for blue and the photoelectric conversion layer R for red. It is noted that the green filter F61 and the magenta filter F62 may be configured in the similar manner to the green filter F51 and the magenta filter F52 of FIG. 19B. Micro-lenses Z61 and Z62 are disposed on the green filter F61 and the magenta filter F62. It is noted that the condensing area of each of the micro-lenses Z61 and Z62 may be set as large as two pixels.

The green light LG transmitted by the color separation element P41 of FIG. 17 enters the photoelectric conversion layers Gr and Gb for green through the green filter F61. Then, for example, the green light is photoelectric-converted at the photoelectric conversion layer Gr for green and charges are therefore generated.

On the other hand, the blue light LB and the red light LR reflected by the color separation element P41 of FIG. 17 enter the photoelectric conversion layer B for blue and the photoelectric conversion layer R for red through the magenta filter F62. Then, the blue light is photoelectric-converted at the photoelectric conversion layer B for blue and charges are therefore generated and accumulated in the photoelectric conversion layer B for blue. Also, the red light is photoelectric-converted at the photoelectric conversion layer R for red and charges are therefore generated and accumulated in the photoelectric conversion layer R for red.

The concentration distribution layer is configured with four-layer structure and the impurity diffusion layer HR62 is disposed in the second concentration distribution layer L2, so that the size of the impurity diffusion layer HR61 of the first concentration distribution layer L1 can be reduced without causing the reduction in the sensitivity of the photoelectric conversion layer R for red, which allows for the improved flexibility in layout design of the row selection transistors TD1 and TD2, the amplification transistors TA1 and TA2, the reset transistors TS1 and TS2, and the readout transistors TB, TR, TGr, and TGb of FIG. 2. For example, the increased size of the amplification transistors TA1 and TA2 allows for the reduced 1/f (RTS) noise. Further, the reduced area of the floating diffusions FD61 to FD63 allows for higher conversion gain and smaller noise which may be generated in the subsequent circuits, so that the higher sensitivity can be achieved.

Ninth Embodiment

Figure 22:
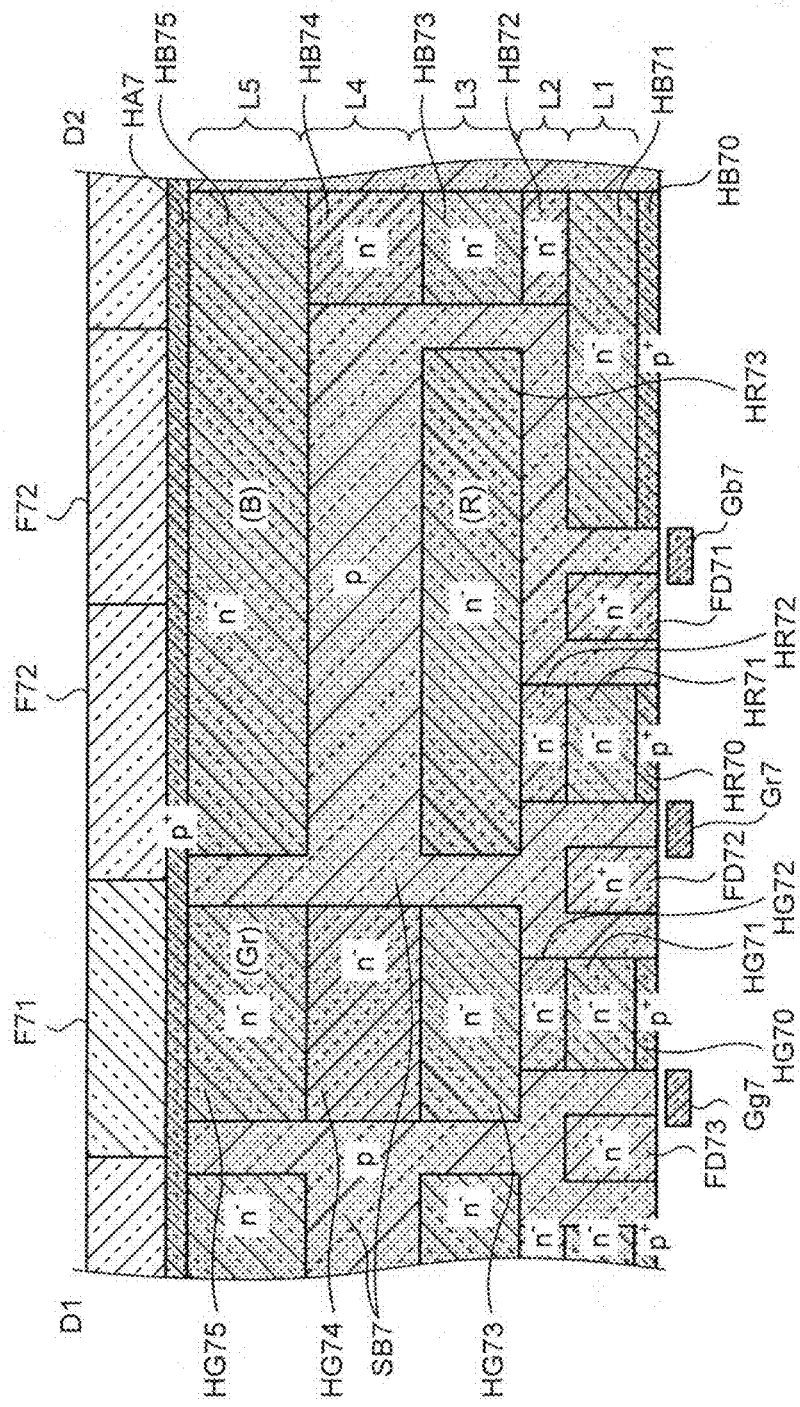
FIG. 22 is a plane view illustrating an example of the configuration of pixel cells of a solid-state imaging device according to a ninth embodiment.
Figure 23A:
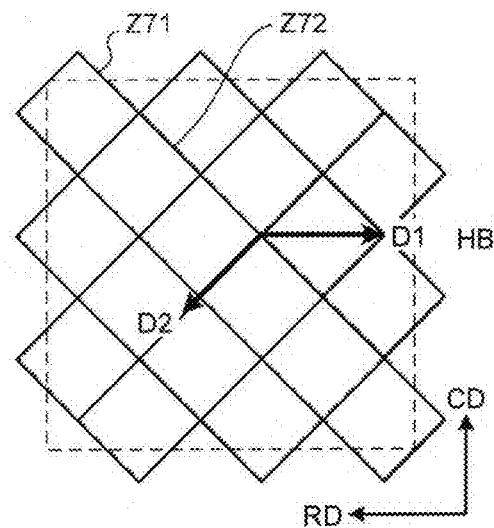
FIG. 23A is a plane view illustrating an example of the configuration of a micro-lens of the solid-state imaging device according to the ninth embodiment.
Figure 23B:
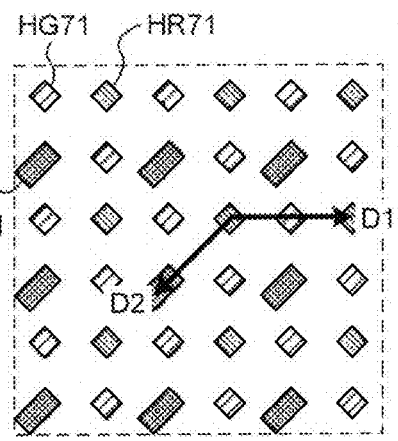
FIG. 23B is a plane view illustrating an example of the configuration of a first concentration distribution layer of FIG. 22.
Figure 23C:
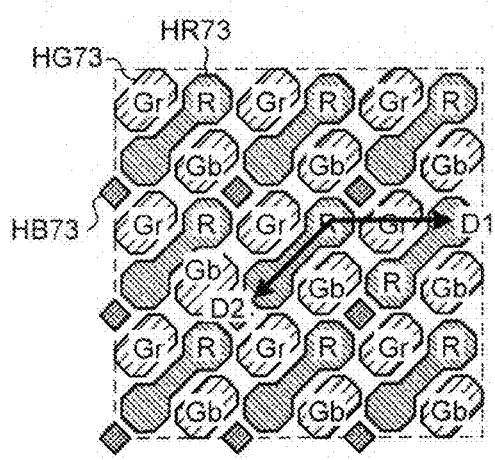
FIG. 23C is a plane view illustrating an example of the configuration of a third concentration distribution layer of FIG. 22.
Figure 23D:
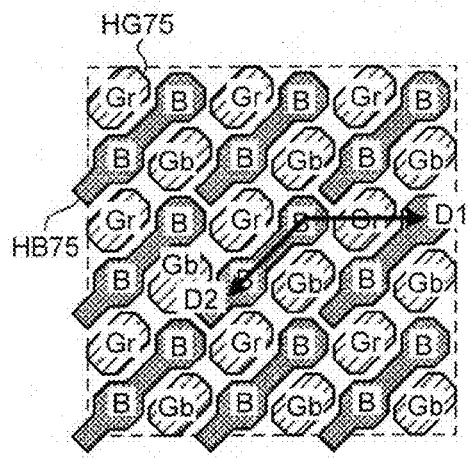
FIG. 23D is a plane view illustrating an example of the configuration of a fifth concentration distribution layer of FIG. 22.

FIG. 22 is a plane view illustrating an example of the configuration of pixel cells of a solid-state imaging device according to a ninth embodiment. FIG. 23A is a plane view illustrating an example of the configuration of a micro-lens of the solid-state imaging device according to the ninth embodiment, FIG. 23B is a plane view illustrating an example of the configuration of a first concentration distribution layer of FIG. 22, FIG. 23C is a plane view illustrating an example of the configuration of a third concentration distribution layer of FIG. 22, and FIG. 23D is a plane view illustrating an example of the configuration of a fifth concentration distribution layer of FIG. 22.

In FIG. 22 and FIG. 23A to FIG. 23D, a first concentration distribution layer L1, a second concentration distribution layer L2, a third concentration distribution layer L3, a fourth concentration distribution layer L4, and a fifth concentration distribution layer L5 are formed from the top surface side toward the back surface side in a semiconductor layer SB7. The semiconductor layer SB7 is formed with a photoelectric conversion layer R for red, photoelectric conversion layers Gr and Gb for green, and a photoelectric conversion layer B for blue.

The photoelectric conversion layers Gr and Gb for green are disposed so as not to overlap the photoelectric conversion layer R for red and the photoelectric conversion layer B for blue in the depth direction. The photoelectric conversion layer B for blue is disposed so that at least a part thereof overlaps the photoelectric conversion layer R for red in the depth direction. Further, the photoelectric conversion layer B for blue, the photoelectric conversion layers Gr and Gb for green, and the photoelectric conversion layer R for red are arranged such that the area of the back surface side of the semiconductor layer SB7 is larger than the top surface side.

Specifically, the photoelectric conversion layer B for blue is provided with impurity diffusion layers HB71 to HB75. The impurity diffusion layers HB71 to HB75 are disposed in the first concentration distribution layer L1, the second concentration distribution layer L2, the third concentration distribution layer L3, the fourth concentration distribution layer L4, and the fifth concentration distribution layer L5, respectively. The impurity diffusion layer HB75 is larger in area than the impurity diffusion layer HB71. It is noted that the impurity diffusion layers HB72, HB73, and HB74 may have the same area as the impurity diffusion layer HB71. Further, the impurity diffusion layer HB75 may be arranged in an integral manner over two pixels neighboring in the orthogonal direction.

The photoelectric conversion layer Gr for green is provided with impurity diffusion layers HG71 to HG75. The impurity diffusion layers HG71 to HG75 are disposed in the first concentration distribution layer L1, the second concentration distribution layer L2, the third concentration distribution layer L3, the fourth concentration distribution layer L4, and the fifth concentration distribution layer L5, respectively. The impurity diffusion layer HG74 is larger in area than the impurity diffusion layer HG71. It is noted that the impurity diffusion layers HG73 and HG75 may have the same area as the impurity diffusion layer HG74. The impurity diffusion layer HG72 may have the same area as the impurity diffusion layer HG71.

The photoelectric conversion layer R for red is provided with impurity diffusion layers HR71 to HR73. The impurity diffusion layers HR71 to HR73 are disposed in the first concentration distribution layer L1, the second concentration distribution layer L2, and the third concentration distribution layer L3, respectively. The impurity diffusion layer HR73 is disposed such that at least a part thereof overlaps the impurity diffusion layers HB71 and HB75 in the depth direction. Further, the impurity diffusion layer HR73 may be arranged in an integral manner over two pixels neighboring in the orthogonal direction.

As illustrated in FIG. 23B, the impurity diffusion layer HB71 can be arranged between the impurity diffusion layers HG71 of the photoelectric conversion layer Gb for green, so that the offsetting in the arrangement with respect to the impurity diffusion layer HR71 can be reduced compared to the layout scheme for the impurity diffusion layer HB61 of FIG. 21B.

Further, pinning layers HB70, HR70, and HG70 are laminated on the impurity diffusion layers HB71, HR71, and HG71, respectively. A pinning layer HA7 is formed on the backside of the semiconductor layer SB7.

In the layered part of the impurity diffusion layers HB71 to HB75, the downward inclination of the potential can be provided from the impurity diffusion layer HB75 toward the impurity diffusion layer HB71 so that the charges generated at the impurity diffusion layer HB75 can move to the impurity diffusion layer HB71. Further, in the layered part of the impurity diffusion layers HB71, HR73, and HB75, the peak of the potential can be provided between the impurity diffusion layers HR73 and HB75 and between the impurity diffusion layers HR73 and HB71 so that the charges generated at the impurity diffusion layer HR73 and the charges generated at the impurity diffusion layer HB75 are not mixed. Also, in the laminated part of the impurity diffusion layers HR71 to HR73 and HB75, the peak of the potential can be provided between the impurity diffusion layers HR73 and HB75 so that the charges generated at the impurity diffusion layer HR73 and the charges generated at the impurity diffusion layer HB75 are not mixed. Also, in the layered part of the impurity diffusion layers HG71 to HG75, the downward inclination of the potential can be provided from the impurity diffusion layer HG75 toward the impurity diffusion layer HG71 so that the charges generated at the impurity diffusion layer HG73 to HG75 can move to the impurity diffusion layer HG71.

Further, in the top surface side of the semiconductor layer SB7, floating diffusions FD71 to FD73 are formed in the gaps between the photoelectric conversion layer R for red, the photoelectric conversion layers Gr and Gb for green, and the photoelectric conversion layer B for blue.

Further, on the semiconductor layer SB7, a gate electrode Gb7 is disposed between the photoelectric conversion layer B for blue and the floating diffusion FD71, a gate electrode Gr7 is disposed between the photoelectric conversion layer R for red and the floating diffusion FD72, and a gate electrode Gg7 is disposed between the photoelectric conversion layer Gr for green and the floating diffusion FD73.

In the back surface side of the semiconductor layer SB7, a green filter F71 and a magenta filter F72 are formed. The green filters F71 are arranged associated with the photoelectric conversion layers Gr and Gb for green. The magenta filters F72 are arranged associated with the photoelectric conversion layer B for blue and the photoelectric conversion layer R for red. It is noted that the green filter F71 and the magenta filter F72 may be configured in the similar manner to the green filter F51 and the magenta filter F52 of FIG. 19B. Micro-lenses Z71 and Z72 are disposed over the green filter F71 and the magenta filter F72. It is noted that the condensing area of each of the micro-lenses Z71 and Z72 may be set as large as two pixels.

The green light LG transmitted by the color separation element P41 of FIG. 17 enters the photoelectric conversion layers Gr and Gb for green through the green filter F71. Then, for example, the green light is photoelectric-converted at the photoelectric conversion layer Gr for green and charges are therefore generated.

On the other hand, the blue light LB and the red light LR reflected by the color separation element P41 of FIG. 17 enter the photoelectric conversion layer B for blue and the photoelectric conversion layer R for red through the magenta filter F72. Then, the blue light is photoelectric-converted at the photoelectric conversion layer B for blue and charges are therefore generated and accumulated in the photoelectric conversion layer B for blue. Also, the red light is photoelectric-converted at the photoelectric conversion layer R for red and charges are therefore generated and accumulated in the photoelectric conversion layer R for red.

The concentration distribution layer is configured with five-layer structure and the impurity diffusion layers HB71 and HB75 are disposed above and below the impurity diffusion layer HR73, respectively, so that the size of the impurity diffusion layer HR71 of the first concentration distribution layer L1 can be reduced and the offsetting in the arrangement of the impurity diffusion layer HB71 can be reduced without causing the reduction in the sensitivity of the photoelectric conversion layer R for red. This allows for the improved symmetry in arrangement while increasing the layout area of the row selection transistors TD1 and TD2, the amplification transistors TA1 and TA2, the reset transistors TS1 and TS2, and the readout transistors TB, TR, TGr, and TGb of FIG. 2, which allows for the improved flexibility in the layout design. For example, the increased size of the amplification transistors TA1 and TA2 allows for the reduced 1/f (RTS) noise. Further, the reduced area of the floating diffusions FD71 to FD73 allows for higher conversion gain and smaller noise which may be generated in the subsequent circuits, so that the higher sensitivity can be achieved.

Tenth Embodiment

Figure 24:
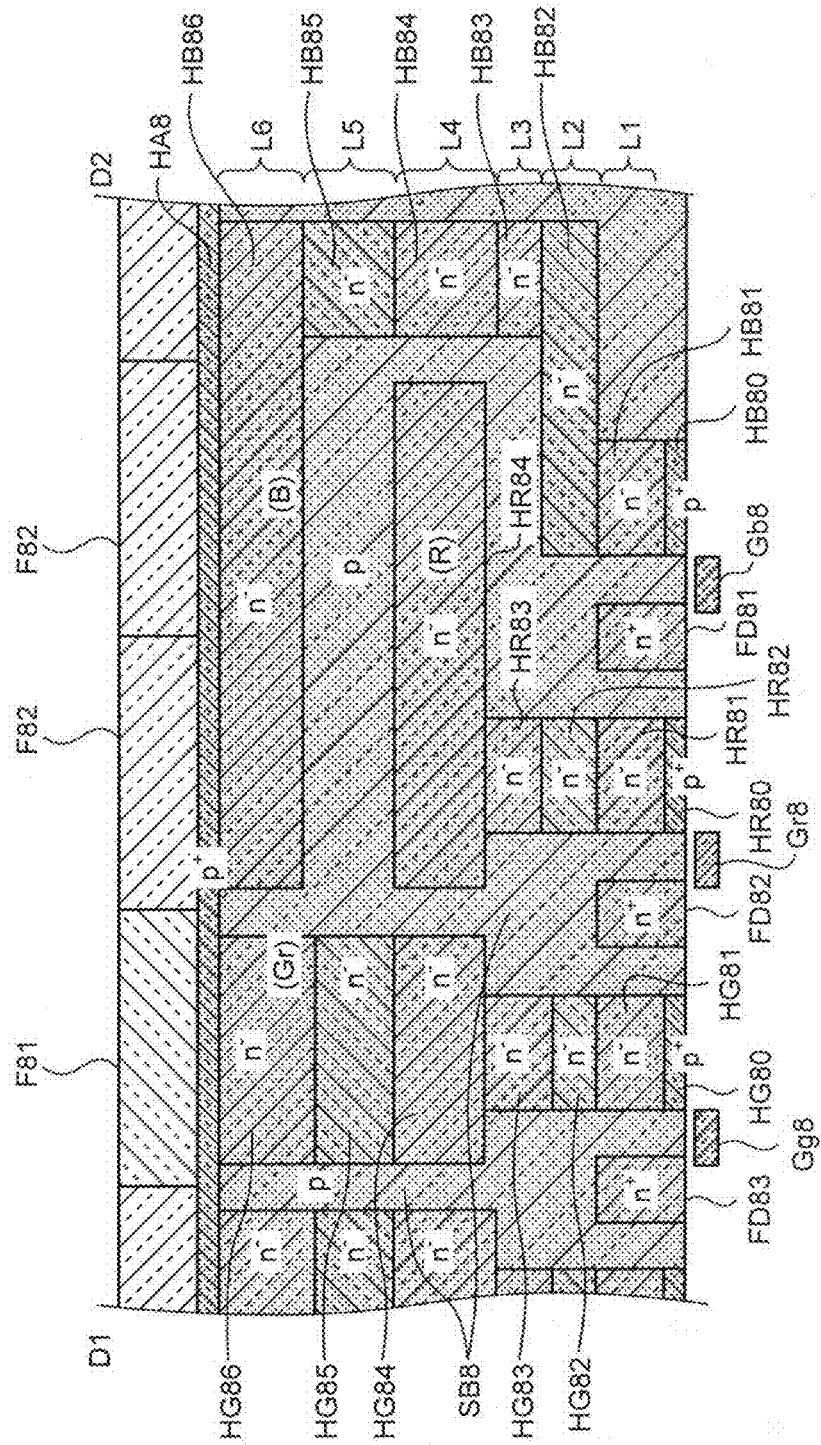
FIG. 24 is a plane view illustrating an example of the configuration of pixel cells of a solid-state imaging device according to a tenth embodiment.
Figure 25A:
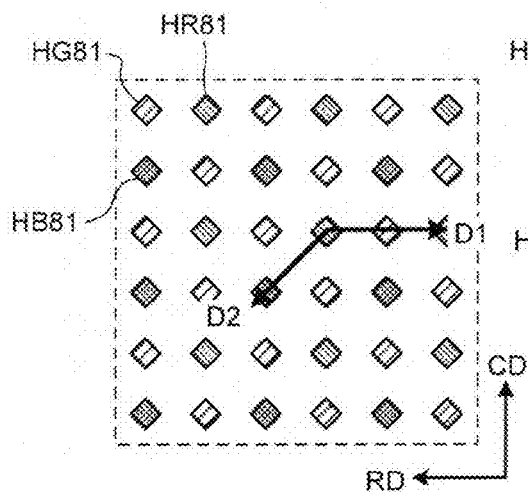
FIG. 25A is a plane view illustrating an example of the configuration of a first concentration distribution layer of FIG. 24.
Figure 25B:
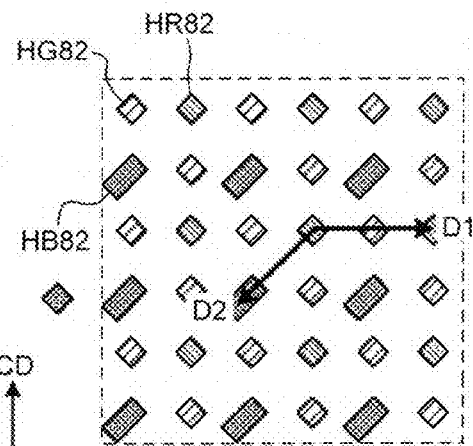
FIG. 25B is a plane view illustrating an example of the configuration of a second concentration distribution layer of FIG. 24.
Figure 25C:
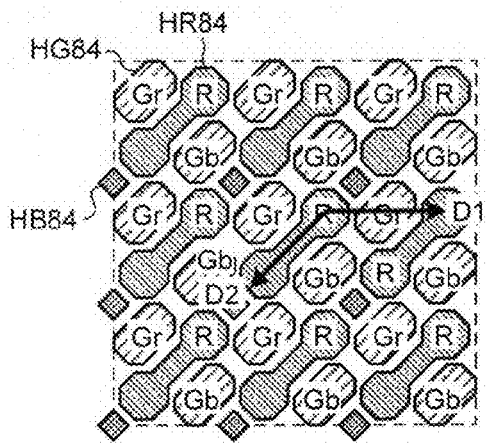
FIG. 25C is a plane view illustrating an example of the configuration of a fourth concentration distribution layer of FIG. 24.
Figure 25D:
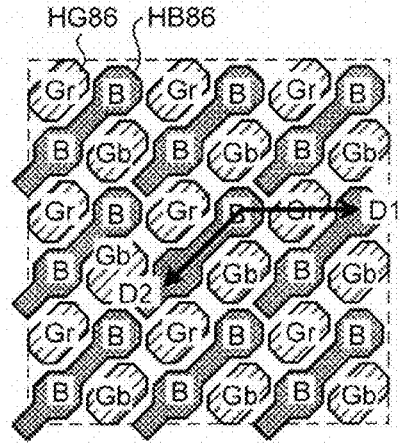
FIG. 25D is a plane view illustrating an example of the configuration of a sixth concentration distribution layer of FIG. 24.

FIG. 24 is a plane view illustrating an example of the configuration of pixel cells of a solid-state imaging device according to the tenth embodiment. FIG. 25A is a plane view illustrating an example of the configuration of a first concentration distribution layer of FIG. 24, FIG. 25B is a plane view illustrating an example of the configuration of a second concentration distribution layer of FIG. 24, FIG. 25C is a plane view illustrating an example of the configuration of a fourth concentration distribution layer of FIG. 24, and FIG. 25D is a plane view illustrating an example of the configuration of a sixth concentration distribution layer of FIG. 24.

In FIG. 24 and FIG. 25A to FIG. 25D, a first concentration distribution layer L1, a second concentration distribution layer L2, a third concentration distribution layer L3, a fourth concentration distribution layer L4, a fifth concentration distribution layer L5, and a sixth concentration distribution layer L6 are formed from the top surface side toward the back surface side in a semiconductor layer SB8. The semiconductor layer SB8 is formed with a photoelectric conversion layer R for red, photoelectric conversion layers Gr and Gb for green, and a photoelectric conversion layer B for blue.

The photoelectric conversion layers Gr and Gb for green are disposed so as not to overlap the photoelectric conversion layer R for red and the photoelectric conversion layer B for blue in the depth direction. The photoelectric conversion layer B for blue is disposed so that at least a part thereof overlaps the photoelectric conversion layer R for red in the depth direction. Further, the photoelectric conversion layer B for blue, the photoelectric conversion layers Gr and Gb for green, and the photoelectric conversion layer R for red are arranged such that the area of the back surface side of the semiconductor layer SB8 is larger than the top surface side.

Specifically, the photoelectric conversion layer B for blue is provided with impurity diffusion layers HB81 to HB86. The impurity diffusion layers HB81 to HB86 are disposed in the first concentration distribution layer L1, the second concentration distribution layer L2, the third concentration distribution layer L3, the fourth concentration distribution layer L4, the fifth concentration distribution layer L5, and the sixth concentration distribution layer L6, respectively. The impurity diffusion layer HB86 is larger in area than the impurity diffusion layer HB81. It is noted that the impurity diffusion layers HB82 to HB85 may be smaller in area than the impurity diffusion layer HB86. Further, the impurity diffusion layer HB86 may be arranged in an integral manner over two pixels neighboring in the orthogonal direction.

The photoelectric conversion layer Gr for green is provided with impurity diffusion layers HG81 to HG86. The impurity diffusion layers HG81 to HG86 are disposed in the first concentration distribution layer L1, the second concentration distribution layer L2, the third concentration distribution layer L3, the fourth concentration distribution layer L4, the fifth concentration distribution layer L5, and the sixth concentration distribution layer L6, respectively. The impurity diffusion layer HG85 is larger in area than the impurity diffusion layer HG81. It is noted that the impurity diffusion layers HG86 and HG84 may have the same area as the impurity diffusion layer HG85. The impurity diffusion layer HG85 and HG83 may have the same area as the impurity diffusion layer HG81.

The photoelectric conversion layer R for red is provided with impurity diffusion layers HR81 to HR84. The impurity diffusion layers HR81 to HR84 are disposed in the first concentration distribution layer L1, the second concentration distribution layer L2, the third concentration distribution layer L3, and the fourth concentration distribution layer L4, respectively. The impurity diffusion layer HR84 is disposed such that at least a part thereof overlaps the impurity diffusion layers HB82 and HB86 in the depth direction. Further, the impurity diffusion layer HR84 may be arranged in an integral manner over two pixels neighboring in the orthogonal direction.

As illustrated in FIG. 25A, the impurity diffusion layer HB81 can be arranged between the impurity diffusion layers HG81 of the photoelectric conversion layer Gb for green, and the shape and area of the impurity diffusion layers HB81, HG81, and HR81 may be the same. This allows for the improved evenness in the layout of the impurity diffusion layers HB81, HG81, and HR81 compared to the layout scheme for the impurity diffusion layers HB71, HG71, and HR71 of FIG. 23B.

Further, pinning layers HB80, HR80, and HG80 are laminated on the impurity diffusion layers HB81, HR81, and HG81, respectively. A pinning layer HA8 is formed on the backside of the semiconductor layer SB8.

Further, in the top surface side of the semiconductor layer SB8, floating diffusions FD81 to FD83 are formed in the gaps among the photoelectric conversion layer R for red, the photoelectric conversion layers Gr and Gb for green, and the photoelectric conversion layer B for blue.

Further, on the semiconductor layer SB8, a gate electrode Gb8 is disposed between the photoelectric conversion layer B for blue and the floating diffusion FD81, a gate electrode Gr8 is disposed between the photoelectric conversion layer R for red and the floating diffusion FD82, and a gate electrode GgB is disposed between the photoelectric conversion layer Gr for green and the floating diffusion FD83.

In the back surface side of the semiconductor layer SB8, a green filter F81 and a magenta filter F82 are formed. The green filters F81 are arranged associated with the photoelectric conversion layers Gr and Gb for green. The magenta filter F82 is arranged associated with the photoelectric conversion layer B for blue and the photoelectric conversion layer R for red. It is noted that the green filter F81 and the magenta filter F82 may be configured in the similar manner to the green filter F51 and the magenta filter F52 of FIG. 19B.

The green light LG transmitted by the color separation element P41 of FIG. 17 enters the photoelectric conversion layers Gr and Gb for green through the green filter F81. Then, for example, the green light is photoelectric-converted at the photoelectric conversion layer Gr for green and charges are therefore generated.

On the other hand, the blue light LB and the red light LR reflected by the color separation element P41 of FIG. 17 enter the photoelectric conversion layer B for blue and the photoelectric conversion layer R for red through the magenta filter F82. Then, the blue light is photoelectric-converted at the photoelectric conversion layer B for blue and charges are therefore generated and accumulated in the photoelectric conversion layer B for blue. Also, the red light is photoelectric-converted at the photoelectric conversion layer R for red and charges are therefore generated and accumulated in the photoelectric conversion layer R for red.

The concentration distribution layer is configured with six-layer structure and the impurity diffusion layers HB81 and HB86 are disposed above and below the impurity diffusion layer HR84, respectively, so that the size of the impurity diffusion layers HR81 and HB81 of the first concentration distribution layer L1 can be reduced and the offsetting in the arrangement of the impurity diffusion layer HB81 can be reduced without causing the reduction in the sensitivity of the photoelectric conversion layer R for red. This allows for the improved symmetry in arrangement while increasing the layout area of the row selection transistors TD1 and TD2, the amplification transistors TA1 and TA2, the reset transistors TS1 and TS2, and the readout transistors TB, TR, TGr, and TGb of FIG. 2, which allows for the improved flexibility in the layout design. For example, the increased size of the amplification transistors TA1 and TA2 allows for the reduced 1/f (RTS) noise. Further, the reduced area of the floating diffusions FD81 to FD83 allows for higher conversion gain and smaller noise which may be generated in the subsequent circuits, so that the higher sensitivity can be achieved.

Eleventh Embodiment

Figure 26A:
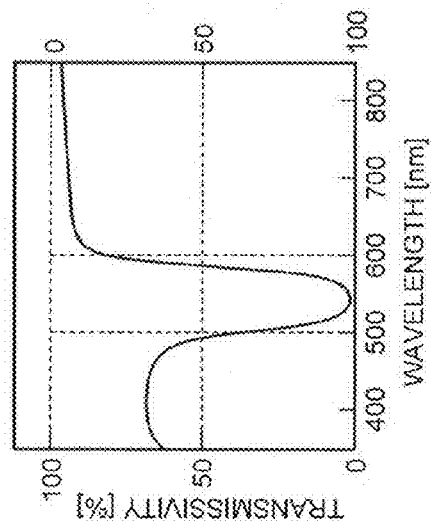
FIG. 26A to FIG. 26C are views illustrating spectral characteristics of a magenta filter adapted to a solid-state imaging device according to an eleventh embodiment.
Figure 26B:
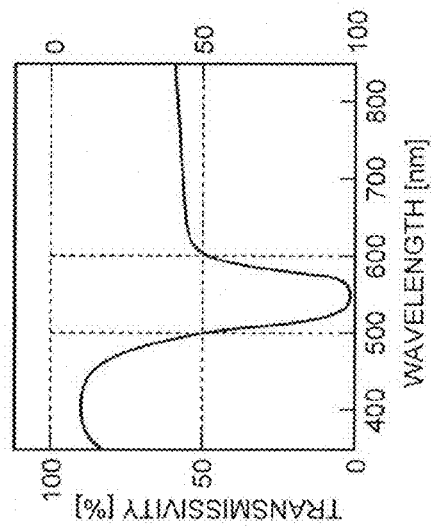
Figure 26C:
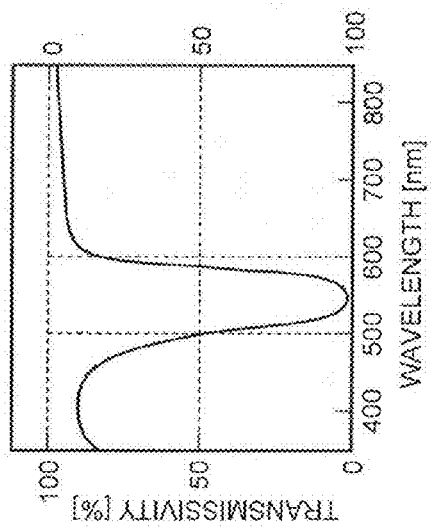

FIG. 26A, FIG. 26B, and FIG. 26C are views illustrating spectral characteristics of a magenta filter adapted to a solid-state imaging device according to an eleventh embodiment.

In FIG. 26A, for this magenta filter, the spectral characteristics is set such that the blue light and the red light are substantially equally transmitted.

On the other hand, in FIG. 26B, the peak of the transmissivity of the red light is reduced with respect to the blue light in this magenta filter. It is noted that the transmissivity of the red light is preferably lower than the transmissivity of the blue light of 40% to 80%.

Furthermore, in FIG. 26C, the peak of the transmissivity of the blue light is reduced with respect to the red light in this magenta filter. It is noted that the transmissivity of the blue light is preferably lower than the transmissivity of the red light of 40% to 80%.

In the case where the filter structure of FIG. 19B is used, the magenta filter F52 on the same row as the photoelectric conversion layer Gr for green may be provided with the spectral characteristics of FIG. 26A, while the magenta filter F52 on the same row as the photoelectric conversion layer Gb for green may be provided with the spectral characteristics of FIG. 26B. This allows for the reduction of the signal amount for red which could be wrongly converted at the photoelectric conversion layer B for blue and thus the purity of the blue light can be improved, which allows for the improved blue color reproducibility as well as the improved S/N ratio of the blue light.

Also, the spectral characteristics of FIG. 26C may be provided. This allows for the reduction of the signal amount for blue which could be wrongly converted at the photoelectric conversion layer R for red and thus the purity of the red light can be improved, which allows for the improved red color reproducibility as well as the improved S/N ratio of the red light.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
   a first photoelectric conversion layer provided for a first wavelength band;
   a second photoelectric conversion layer provided for a second wavelength band;
   a third photoelectric conversion layer provided for a third wavelength band;
   a first color filter adapted to absorb a light of the first wavelength band and transmit lights of the second wavelength band and the third wavelength band included in an incident light; and
   a first color separation element adapted to separate a transmission light transmitted through the first color filter into a light including the second wavelength band and a light including the third wavelength band, wherein an angle of incidence of the transmission light transmitted through the first color filter with respect to a reflection surface of the first color separation element is set to be within a range of 20 to 30 degrees.

2. The solid-state imaging device according to claim 1,
   wherein the first color separation element separates the transmission light transmitted through the first color filter into a transmission light including the second wavelength band and a reflection light including the third wavelength band, and
   wherein the angle of incidence of the transmission light transmitted through the first color filter with respect to the reflection surface of the first color separation element is set so that a vertically polarized light and a horizontally polarized light are included in the reflection light.

3. The solid-state imaging device according to claim 1, wherein the first color separation element comprises:
   a dichroic filter adapted to transmit the light including the second wavelength band and reflect the light including the third wavelength band; and
   a reflection block adapted to support the dichroic filter over the second photoelectric conversion layer and guide the light including the third wavelength band to the third photoelectric conversion layer by reflecting twice in the reflection block.

4. The solid-state imaging device according to claim 3 further comprising a condensing unit provided on the first color filter and having a condensing area as large as two pixels.

5. The solid-state imaging device according to claim 1 further comprising:
   a second color filter adapted to absorb the light of the second wavelength band included in an incident light and transmit the lights of the first wavelength band and the second wavelength band; and
   a second color separation element adapted to separate a transmission light transmitted through the second color filter into a light including the first wavelength band and a light including the second wavelength band.

6. The solid-state imaging device according to claim 5,
   wherein the first photoelectric conversion layer comprises a photoelectric conversion layer for red,
   wherein the second photoelectric conversion layer comprises a first photoelectric conversion layer for green and a second photoelectric conversion layer for green,
   wherein the third photoelectric conversion layer comprises a photoelectric conversion layer for blue,
   wherein the first color filter comprises a cyan filter adapted to transmit a green light and a blue light of the incident light,
   wherein the second color filter comprises a yellow filter adapted to transmit the green light and a red light of the incident light,
   wherein the first color separation element separates a transmission light transmitted through the cyan filter into the green light and the blue light by transmission and reflection, makes the green light to enter the first photoelectric conversion layer for green, and makes the blue light to enter the photoelectric conversion layer for blue, and
   wherein the second color separation element separates a transmission light transmitted through the yellow filter into the green light and the red light by transmission and reflection, makes the green light to enter the second photoelectric conversion layer for green, and makes the red light to enter the photoelectric conversion layer for red.

7. A solid-state imaging device comprising:
   a first photoelectric conversion layer provided for a first wavelength band;
   a second photoelectric conversion layer provided for a second wavelength band;
   a third photoelectric conversion layer provided for a third wavelength band;
   a first color separation element adapted to separate an incident light into a light including the first wavelength band and a light including the second wavelength band and the third wavelength band; and
   a first color filter adapted to absorb a light of the second wavelength band and transmit a light of the third wavelength band with respect to the light including the second wavelength band and the third wavelength band separated by the first color separation element.

8. The solid-state imaging device according to claim 7,
   wherein the first color separation element separates the incident light into a transmission light including the first wavelength band and a reflection light including the second wavelength band and the third wavelength band, and
   wherein an angle of incidence of the incident light with respect to a reflection surface of the first color separation element is set so that a vertically polarized light and a horizontally polarized light are included in the reflection light.

9. The solid-state imaging device according to claim 8, wherein the angle of incidence of the incident light with respect to the reflection surface is set to be within a range of 20 to 30 degrees.

10. The solid-state imaging device according to claim 7, wherein the first color separation element comprises:
  a dichroic filter adapted to transmit the light including the first wavelength band and reflect the light including the second wavelength band and the third wavelength band; and
  a reflection block adapted to support the dichroic filter over the first photoelectric conversion layer and guide the light including the second wavelength band and the third wavelength band to the first color filter by reflecting twice in the reflection block.

11. The solid-state imaging device according to claim 10 further comprising a condensing unit provided on the dichroic filter and having a condensing area as large as two pixels.

12. The solid-state imaging device according to claim 7 further comprising:
  a second color separation element adapted to separate an incident light into a light including the first wavelength band and a light including the second wavelength band and the third wavelength band; and
  a second color filter adapted to absorb the light of the third wavelength band and transmit the light of the second wavelength band with respect to the light including the second wavelength band and the third wavelength band separated by the second color separation element.

13. The solid-state imaging device according to claim 12, wherein the first photoelectric conversion layer comprises a first photoelectric conversion layer for green and a second photoelectric conversion layer for green,
  wherein the second photoelectric conversion layer comprises a photoelectric conversion layer for red,
  wherein the third photoelectric conversion layer comprises a photoelectric conversion layer for blue,
  wherein the first color filter comprises a blue filter adapted to transmit a blue light reflected by the first color separation element,
  wherein the second color filter comprises a red filter adapted to transmit a red light reflected by the second color separation element,
  wherein the first color separation element separates the incident light into the green light and the red and the blue lights by transmission and reflection, makes the green light to enter the first photoelectric conversion layer for green, and makes the red and blue lights to enter the blue filter, and
  wherein the second color separation element separates the incident light into the green light and the red and blue lights by transmission and reflection, makes the green light to enter the second photoelectric conversion layer for green, and makes the red and blue lights to enter the red filter.

14. A solid-state imaging device comprising:
  a first photoelectric conversion layer provided for a first wavelength band;
  a second photoelectric conversion layer provided for a second wavelength band;
  a third photoelectric conversion layer provided for a third wavelength band such that at least a part of the third photoelectric conversion layer overlaps the first photoelectric conversion layer in a depth direction; and
  a color separation element adapted to separate an incident light into a light including the first wavelength band and the third wavelength band and a light including the second wavelength band.

15. The solid-state imaging device according to claim 14, wherein the color separation element separates the incident light into a transmission light including the second wavelength band and a reflection light including the first wavelength band and the third wavelength band, and
  wherein an angle of incidence of the incident light with respect to a reflection surface of the first color separation element is set so that a vertically polarized light and a horizontally polarized light are included in the reflection light.

16. The solid-state imaging device according to claim 15, wherein the angle of incidence of the incident light with respect to the reflection surface is set to be within a range of 20 to 30 degrees.

17. The solid-state imaging device according to claim 14, wherein the color separation element comprises:
  a dichroic filter adapted to transmit the light including the first wavelength band and reflect the light including the second wavelength band and the third wavelength band; and
  a reflection block adapted to support the dichroic filter over the first photoelectric conversion layer and guide the light including the second wavelength light and the third wavelength band to the second photoelectric conversion layer and the third photoelectric conversion layer by reflecting twice in the reflection block.

18. The solid-state imaging device according to claim 17 further comprising a condensing unit provided on the dichroic filter and having a condensing area as large as two pixels.

19. The solid-state imaging device according to claim 14, wherein the first photoelectric conversion layer comprises a photoelectric conversion layer for green,
  wherein the second photoelectric conversion layer comprises a photoelectric conversion layer for red,
  wherein the third photoelectric conversion layer comprises a photoelectric conversion layer for blue, and
  wherein the color separation element separates the incident light into the green light and the red and blue lights by transmission and reflection, makes the green light to enter the photoelectric conversion layer for green, makes the blue light to enter the photoelectric conversion layer for blue, and causes the red light to enter the photoelectric conversion layer for red.

* * * * *